(12) United States Patent
Shibata et al.

(10) Patent No.: US 11,797,829 B2
(45) Date of Patent: *Oct. 24, 2023

(54) PRODUCT-SUM OPERATION DEVICE, NEUROMORPHIC DEVICE, AND METHOD FOR USING PRODUCT-SUM OPERATION DEVICE

(71) Applicant: TDK CORPORATION, Tokyo (JP)

(72) Inventors: Tatsuo Shibata, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 684 days.

This patent is subject to a terminal disclaimer.

(21) Appl. No.: 16/759,080

(22) PCT Filed: Dec. 12, 2018

(86) PCT No.: PCT/JP2018/045725
§ 371 (c)(1),
(2) Date: Apr. 24, 2020

(87) PCT Pub. No.: WO2019/131141
PCT Pub. Date: Jul. 4, 2019

(65) Prior Publication Data
US 2020/0327400 A1    Oct. 15, 2020

(30) Foreign Application Priority Data

Dec. 28, 2017 (JP) ................................ 2017-254702

(51) Int. Cl.
*G06N 3/063* (2023.01)
*G06F 7/38* (2006.01)
(Continued)

(52) U.S. Cl.
CPC ............. *G06N 3/063* (2013.01); *G06F 7/383* (2013.01); *G06F 7/50* (2013.01); *G06F 7/523* (2013.01); *G06F 7/5443* (2013.01)

(58) Field of Classification Search
CPC . G06F 7/383; G06F 7/50; G06F 7/523; G06F 7/5443
See application file for complete search history.

(56) References Cited

U.S. PATENT DOCUMENTS

| 11,442,695 B2 | 9/2022 | Shibata |
| 2013/0151894 A1 | 6/2013 | Honda et al. |

(Continued)

FOREIGN PATENT DOCUMENTS

| JP | 2009-282782 A | 12/2009 |
| JP | 5160304 B2 | 3/2013 |

(Continued)

OTHER PUBLICATIONS

Chen et al.; "Optimized Learning Scheme for Grayscale Image Recognition in a RRAM Based Analog Neuromorphic System;" IEEE; 2015; pp. 17.7.1-17.7.4.

(Continued)

*Primary Examiner* — Michael D. Yaary
(74) *Attorney, Agent, or Firm* — Oliff PLC

(57) ABSTRACT

The product-sum operation device includes a product operator and a sum operator. The product operator includes a plurality of product operation elements, and an alternative element that, when any of the plurality of product operation elements has malfunctioned, is used instead of the malfunctioning product operation element. Each of the plurality of product operation elements and the alternative element is a resistance change element. The sum operator includes an output detector which detects a sum of outputs from the plurality of product operation elements when the alternative element is not used.

14 Claims, 14 Drawing Sheets

(51) Int. Cl.
    *G06F 7/50*     (2006.01)
    *G06F 7/523*     (2006.01)
    *G06F 7/544*     (2006.01)

(56) References Cited

U.S. PATENT DOCUMENTS

| | | |
|---|---|---|
| 2017/0331484 A1 | 11/2017 | Kudo |
| 2018/0350432 A1 | 12/2018 | Sasaki |
| 2019/0171418 A1 | 6/2019 | Morie et al. |
| 2020/0257501 A1 | 8/2020 | Yabuuchi |
| 2021/0288357 A1* | 9/2021 | Kuriki ................. H01M 10/441 |

FOREIGN PATENT DOCUMENTS

| | | |
|---|---|---|
| JP | 2013-122748 A | 6/2013 |
| JP | 2017-204833 A | 11/2017 |
| WO | 2017/183573 A1 | 10/2017 |
| WO | 2018/034163 A1 | 2/2018 |

OTHER PUBLICATIONS

Burr et al.; "Neuromorphic computing using non-volatile memory;" Advances in Physics: X; 2017; pp. 89-124; vol. 2, No. 1; pp. 89-124.
Feb. 19, 2019 Search Report issued in International Patent Application No. PCT/JP2018/045725.
Feb. 19, 2019 Search Report issued in International Patent Application No. PCT/JP2018/045714.

\* cited by examiner

PRODUCT-SUM OPERATION DEVICE, NEUROMORPHIC DEVICE, AND METHOD FOR USING PRODUCT-SUM OPERATION DEVICE

TECHNICAL FIELD

The present invention relates to a product-sum operation device, a neuromorphic device, and a method for using the product-sum operation device. Priority is claimed on Japanese Patent Application No. 2017-254702, filed Dec. 28, 2017, the content of which is incorporated herein by reference.

BACKGROUND ART

In the related art, a learning scheme optimized for grayscale image recognition in an RRAM (registered trademark)-based analog neuromorphic system is known (see, for example, Non-Patent Document 1). This document describes development of an analog neuromorphic system on the basis of an assembled resistance switching memory array. This literature proposes a new training scheme to optimize the performance of analog systems by utilizing segmented synaptic behaviors. This document also applies the scheme to grayscale image recognition.

Research has also been conducted to realize a neural network imitating a nervous system by using an array of resistance change elements. A neuromorphic device (NMD) performs a product-sum operation to product weight and sum values from the previous stage to the next stage. Thus, development of various types of product-sum operation devices, each of which combines a plurality of resistance change elements whose resistances change continuously, performs product operations on input signals using their resistance values as weights, and performs sum operation to obtain the sum of currents output from the resistance change elements, and NMDs using the product-sum operation devices has been promoted.

CITATION LIST

Patent Literature

[Patent Document 1]
PCT International Publication No. WO2017/183573

Non-Patent Literature

[Non-Patent Document 1]
Zhe Chen et al., "Optimized Learning Scheme for Grayscale Image Recognition in a RRAM Based Analog Neuromorphic System," 2015, IEEE, p. 17.7.1-p. 17.7.4

SUMMARY OF INVENTION

Technical Problem

Incidentally, Non-Patent Document 1 does not discuss measures against malfunctions of elements included in the system. Therefore, there is a possibility that the performance of the neural network may greatly deteriorate when an element included in the system has malfunctioned. In addition, it is very difficult to manufacture devices that are 100% malfunction-free. Therefore, it is economically necessary to replace malfunctioning elements with normal elements such that a whole device can function. However, such compensation elements in a neural network are still not being discussed.

In view of the above problems, it is an object of the present invention to provide a product-sum operation device, a neuromorphic device, and a method for using the product-sum operation device which can, when applied to a neural network, curb deterioration of the performance of the neural network upon occurrence of a malfunction of an element included in the product-sum operation device.

Solution to Problem

A product-sum operation device of an aspect of the present invention includes a product operator and a sum operator, wherein the product operator includes a plurality of product operation elements and at least one alternative element that, when any of the plurality of product operation elements has malfunctioned, is used instead of the malfunctioning product operation element, the plurality of product operation elements and the alternative element are each a resistance change element, the sum operator includes an output detector, and the output detector is configured to detect a sum of outputs from the plurality of product operation elements when the alternative element is not used.

An aspect of the present invention is a method for using the product-sum operation device, wherein the product-sum operation device further includes an inspector configured to inspect whether or not each of the plurality of product operation elements has malfunctioned, and the method includes an inspection process in which the inspector is configured to determine whether or not each of the plurality of product operation elements has malfunctioned on the basis of outputs from the plurality of product operation elements detected by the output detector.

In the method for using the product-sum operation device of an aspect of the present invention, the product-sum operation device may further include a function replacer, and the method may further include a function replacement process in which, when the inspector has detected that any of the plurality of product operation elements has malfunctioned, the function replacer causes the alternative element to perform a product operation that the malfunctioning product operation element performed before malfunctioning.

In the method for using the product-sum operation device of an aspect of the present invention, a resistance value of the alternative element that performs the product operation that the malfunctioning product operation element performed before malfunctioning may be preset to an intermediate value that is greater than a minimum value of a resistance value fluctuation range of the alternative element and smaller than a maximum value of the resistance value fluctuation range.

In the product-sum operation device of an aspect of the present invention, the at least one alternative element may be a plurality of product operation alternative elements, and the sum operator may further include an alternative output detector configured to detect a sum of outputs from the plurality of product operation alternative elements.

An aspect of the present invention is a method for using the product-sum operation device, wherein the product-sum operation device further includes an inspector and a function replacer, and the method includes a function replacement process in which, when the inspector has detected that any of the plurality of product operation elements has malfunctioned, the function replacer causes the plurality of product operation alternative elements to perform product operations that the plurality of product operation elements performed before malfunctioning, and a resistance value setting process in which the function replacer sets resistance values of the plurality of product operation alternative elements to values equal to resistance values of the plurality of product operation elements before malfunctioning.

In the product-sum operation device of an aspect of the present invention, the alternative element may be disposed on a side opposite to the output detector across the plurality of product operation elements.

In the product-sum operation device of an aspect of the present invention, the output detector may be disposed on a side opposite to the plurality of product operation elements across the alternative element.

In the product-sum operation device of an aspect of the present invention, the plurality of product operation elements may include a first product operation element and a second product operation element, and the alternative element may be disposed between the first product operation element and the second product operation element.

An aspect of the present invention is a method for using the product-sum operation device, wherein the plurality of product operation elements include a plurality of variable-input product operation elements and at least one fixed-input product operation element, the alternative element is the fixed-input alternative element, the product-sum operation device further includes a variable input unit configured to input a variable signal to the plurality of variable-input product operation elements, a fixed input unit configured to input a determined signal to the fixed-input product operation element and the fixed-input alternative element in synchronization with the variable signal, an inspector configured to inspect whether or not the fixed-input product operation element has malfunctioned, and a function replacer, and the method includes an inspection process in which the inspector is configured to determine whether or not each of the fixed-input product operation element has malfunctioned on the basis of an output from the fixed-input product operation element detected by the output detector, and a function replacement process in which, when the inspector has detected that the fixed-input product operation element has malfunctioned, the function replacer causes the fixed-input alternative element to perform a product operation that the fixed-input product operation element performed before malfunctioning.

In the method for using the product-sum operation device of an aspect of the present invention, the fixed-input alternative element may be disposed adjacent to the fixed-input product operation element.

In the product-sum operation device of an aspect of the present invention, the resistance change element may have a write terminal, a common terminal, and a read terminal.

In the product-sum operation device of an aspect of the present invention, the resistance change element may be a magnetoresistance effect element exhibiting a magnetoresistance effect, and the magnetoresistance effect element may include a magnetization free layer having a domain wall, a magnetization fixed layer whose magnetization direction is fixed, and a nonmagnetic layer sandwiched between the magnetization free layer and the magnetization fixed layer.

An aspect of the present invention is a neuromorphic device including the product-sum operation device.

Advantageous Effects of Invention

According to the present invention, it is possible to provide a product-sum operation device, a neuromorphic device, and a method for using the product-sum operation device which can, when applied to a neural network, curb deterioration of the performance of the neural network upon occurrence of a malfunction of an element included in the product-sum operation device.

DESCRIPTION OF EMBODIMENTS

Hereinafter, embodiments of a product-sum operation device, a neuromorphic device, and a method for using the product-sum operation device according to the present invention will be described with reference to the drawings.

<First Embodiment> (where Resistance Change Elements are Magnetoresistance Effect Elements)

Figure 1:
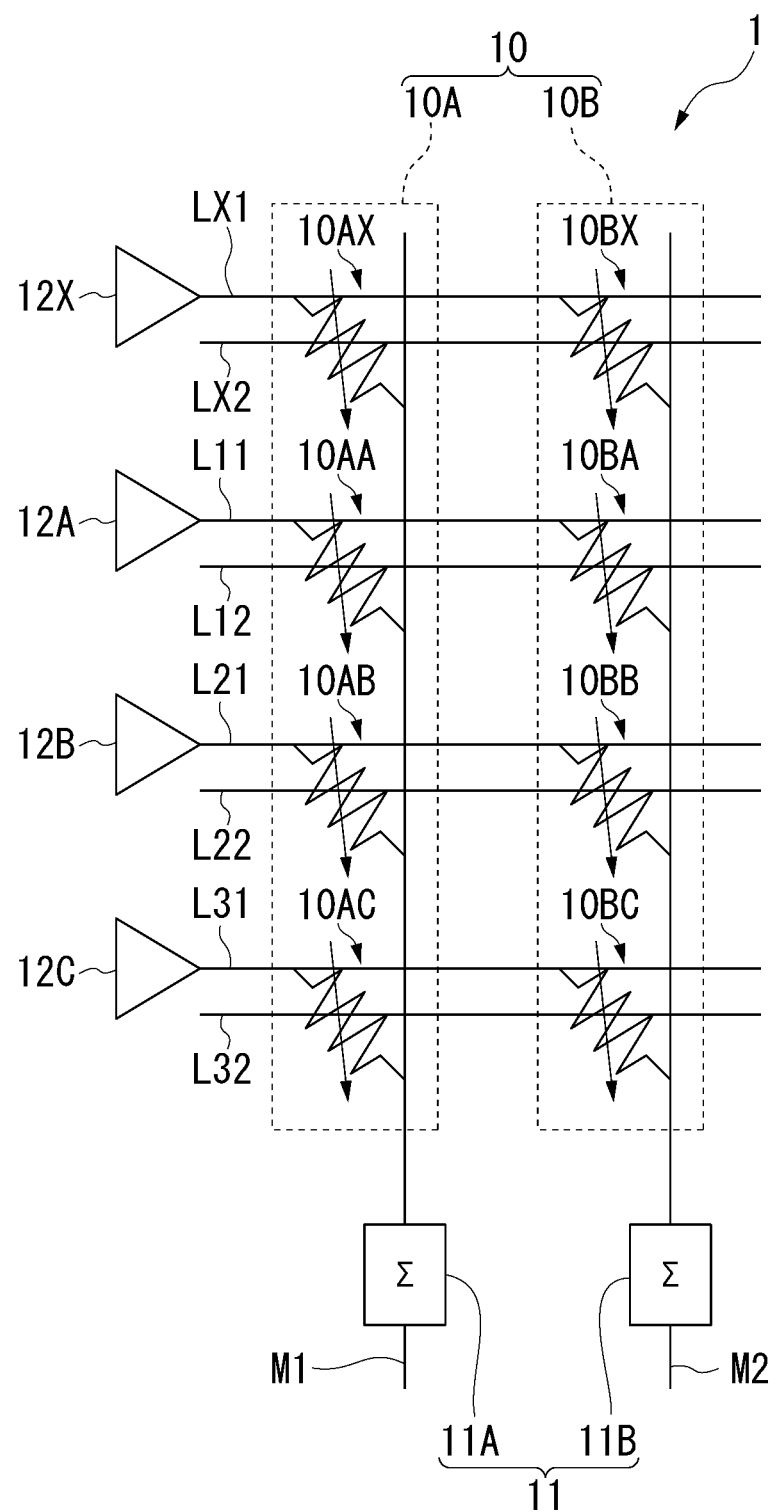
FIG. 1 is a diagram showing a first example of a partial configuration of a product-sum operation device according to a first embodiment.
Figure 2:
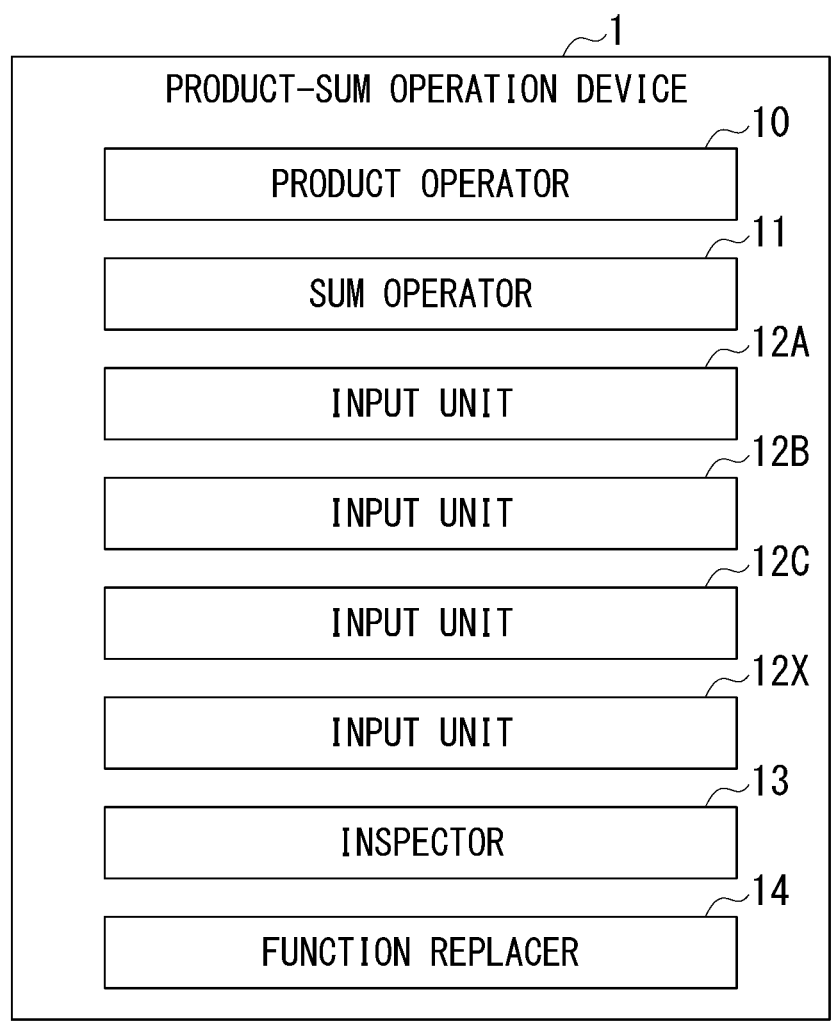
FIG. 2 is a diagram showing an example of an overall configuration of the product-sum operation device of the first embodiment.

FIG. 1 is a diagram showing a first example of a partial configuration of a product-sum operation device 1 of a first embodiment. FIG. 2 is a diagram showing an example of an overall configuration of the product-sum operation device 1 of the first embodiment.

In the example shown in FIGS. 1 and 2, the product-sum operation device 1 of the first embodiment includes a product operator 10, a sum operator 11, input units 12A, 12B, 12C, and 12X, an inspector 13, and a function replacer 14. The product operator 10 includes a column 10A and a column 10B.

In the example shown in FIG. 1, the product operator 10 includes two columns 10A and 10B. However, in another example, the product operator 10 may include any number of columns 10A, 10B, . . . equal to or greater than three.

In the example shown in FIG. 1, the column 10A includes a product operation element 10AA, a product operation element 10AB, a product operation element 10AC, and an alternative element 10AX. The product operation elements 10AA, 10AB, and 10AC perform product operations. When any of the product operation elements 10AA, 10AB, and 10AC has malfunctioned, the alternative element 10AX is used instead of the malfunctioning product operation element.

The column 10B includes a product operation element 10BA, a product operation element 10BB, a product operation element 10BC, and an alternative element 10BX. The product operation elements 10BA, 10BB, and 10BC perform product operations in the same manner as the product operation elements 10AA, 10AB, and 10AC. When any of the product operation elements 10BA, 10BB, and 10BC has malfunctioned, the alternative element 10BX is used instead of the malfunctioning product operation element.

In the example shown in FIG. 1, the column 10A includes three product operation elements 10AA, 10AB, and 10AC and the column 10B includes three product operation elements 10BA, 10BB, and 10BC. However, in another example, the column 10A may include any number (specifically, a plurality) of product operation elements other than three and the column 10B may include any number (specifically, a plurality) of product operation elements other than three.

In the example shown in FIG. 1, the column 10A includes one alternative element 10AX and the column 10B includes one alternative element 10BX. However, in another example, the column 10A may include two or more alternative elements and the column 10B may include two or more alternative elements.

In the example shown in FIG. 1, each of the plurality of product operation elements 10AA to 10AC and 10BA to 10BC and the alternative elements 10AX and 10BX is a resistance change element having a read terminal, a write terminal, and a common terminal.

The read terminals of the product operation elements 10AA and 10BA are connected to a line L11. The line L11 is connected to the input unit 12A that inputs a signal to the product operation elements 10AA and 10BA. The write terminals of the product operation elements 10AA and 10BA are connected to a line L12.

The read terminals of the product operation elements 10AB and 10BB are connected to a line L21. The line L21 is connected to the input unit 12B that inputs a signal to the product operation elements 10AB and 10BB. The write terminals of the product operation elements 10AB and 10BB are connected to a line L22.

The read terminals of the product operation elements 10AC and 10BC are connected to a line L31. The line L31 is connected to the input unit 12C that inputs a signal to the product operation elements 10AC and 10BC. The write terminals of the product operation elements 10AC and 10BC are connected to a line L32.

The read terminals of the alternative elements 10AX and 10BX are connected to a line LX1. The line LX1 is connected to the input unit 12X that inputs a signal to the alternative elements 10AX and 10BX. The write terminals of the alternative elements 10AX and 10BX are connected to a line LX2.

The common terminals of the product operation elements 10AA, 10AB, and 10AC and the alternative element 10AX are connected to a line M1. The common terminals of the product operation elements 10BA, 10BB, and 10BC and the alternative element 10BX are connected to a line M2.

In the example shown in FIG. 1, the sum operator 11 includes an output detector 11A and an output detector 11B.

When the alternative element 10AX is not used, the output detector 11A detects the sum of outputs from the plurality of product operation elements 10AA, 10AB, and 10AC. For example, when the product operation element 10AA has malfunctioned and the alternative element 10AX is used instead of the malfunctioning product operation element 10AA, the output detector 11A detects the sum of outputs from the product operation elements 10AB and 10AC (that is, the non-malfunctioning product operation elements 10AB and 10AC among the plurality of product operation elements 10AA, 10AB, and 10AC) and an output from the alternative element 10AX.

When the alternative element 10BX is not used, the output detector 11B detects the sum of outputs from the plurality of product operation elements 10BA, 10BB, and 10BC. For example, when the product operation element 10BB has malfunctioned and the alternative element 10BX is used instead of the malfunctioning product operation element 10BB, the output detector 11B detects the sum of outputs from the product operation elements 10BA and 10BC (that is, the non-malfunctioning product operation elements 10BA and 10BC among the plurality of product operation elements 10BA, 10BB, and 10BC) and an output from the alternative element 10BX.

The output detector 11A is disposed on the line M1. The output detector 11B is disposed on the line M2.

In the example shown in FIG. 1, the output detector 11A detects output current values from the product operation elements 10AA, 10AB, and 10AC or output current values from, for example, the product operation elements 10AB and 10AC and the alternative element 10AX and the output detector 11B detects output current values from the product operation elements 10BA, 10BB, and 10BC or output current values from, for example, the product operation elements 10BA and 10BC and the alternative element 10BX. In another example, the output detector 11A may detect outputs from the product operation elements 10AA, 10AB, and 10AC as charges or outputs of, for example, the product operation elements 10AB and 10AC and the alternative element 10AX as charges, and the output detector 11B may detect outputs from the product operation elements 10BA, 10BB, and 10BC as charges or outputs of, for example, the product operation elements 10BA and 10BC and the alternative element 10BX as charges.

When the sum of outputs from the plurality of product operation elements 10AA, 10AB, and 10AC detected by the output detector 11A exceeds a specified value, the inspector 13 determines that an output current increase malfunction has occurred in at least one of the plurality of product operation elements 10AA to 10AC included in the column 10A. Also, when the sum of outputs from the plurality of product operation elements 10BA, 10BB, and 10BC detected by the output detector 11B exceeds the specified value, the inspector 13 determines that an output current increase malfunction has occurred in at least one of the plurality of product operation elements 10BA to 10BC included in the column 10B.

Figure 3:
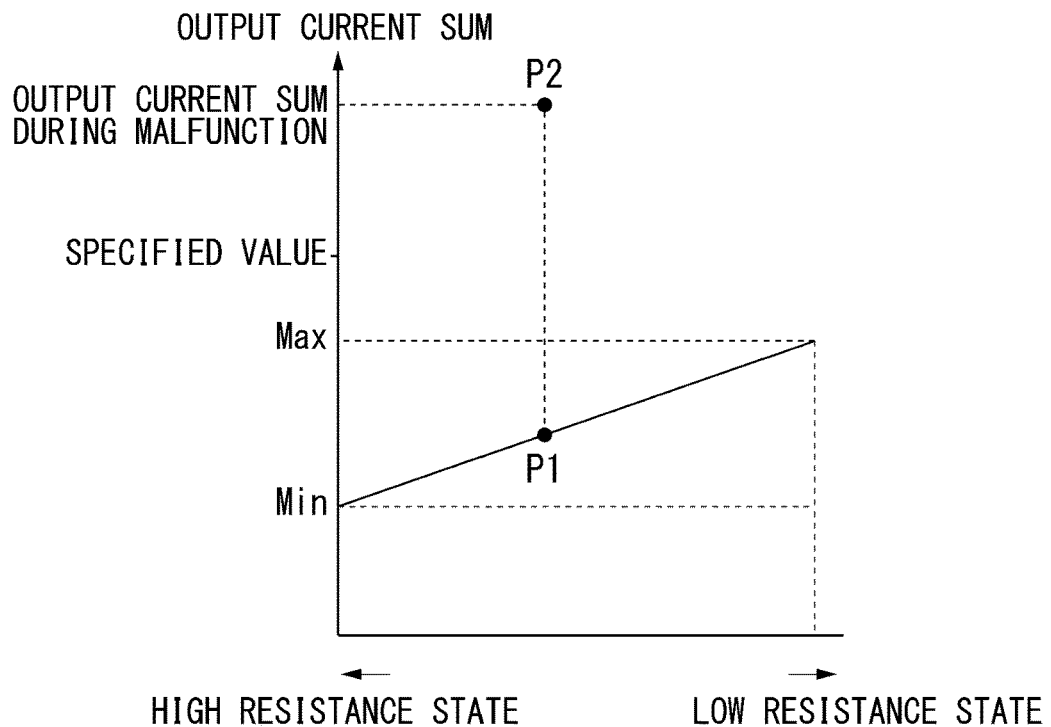
FIG. 3 is a diagram showing a sum detected by an output detector and a specified value.

FIG. 3 is a diagram showing the sum detected by the output detector 11A and the specified value. In FIG. 3, the vertical axis indicates the sum of output currents of the plurality of product operation elements 10AA to 10AC detected by the output detector 11A, the specified value, and the like. The horizontal axis indicates states (magnitudes of resistance values) of the product operation elements 10AA to 10AC.

When the plurality of product operation elements 10AA to 10AC operate normally and the resistance values of the product operation elements 10AA to 10AC are the highest, the sum of output currents of the plurality of product operation elements 10AA to 10AC detected by the output detector 11A is a minimum value Min.

When the plurality of product operation elements 10AA to 10AC operate normally, the sum of output currents of the plurality of product operation elements 10AA to 10AC detected by the output detector 11A increases as the resistance values of the product operation elements 10AA to 10AC decrease.

When the plurality of product operation elements 10AA to 10AC operate normally and the resistance values of the product operation elements 10AA to 10AC are the lowest, the sum of output currents of the plurality of product operation elements 10AA to 10AC detected by the output detector 11A is a maximum value Max.

The specified value is set to a value equal to or greater than the maximum value Max. That is, the specified value is equal to or greater than the maximum value Max of the sum that can be detected by the output detector 11A when the plurality of product operation elements 10AA to 10AC all operate normally.

In the example shown in FIG. 3, in the state of a point P1, the sum of output currents of the product operation elements 10AA to 10AC detected by the output detector 11A does not exceed the specified value. Therefore, the inspector 13 determines that there is a high possibility that an output current increase malfunction has not occurred in any of the plurality of product operation elements 10AA to 10AC included in the column 10A.

On the other hand, in the state of a point P2, the sum of output currents of the product operation elements 10AA to 10AC detected by the output detector 11A exceeds the specified value. Therefore, the inspector 13 determines that an output current increase malfunction has occurred in at least one of the plurality of product operation elements 10AA to 10AC included in the column 10A.

In the example shown in FIGS. 1 and 2, the inspector 13 inspects whether or not each of the plurality of product operation elements 10AA, 10AB, and 10AC has malfunctioned.

To inspect whether or not the product operation element 10AA has malfunctioned, for example, the output detector 11A detects an output from the product operation element 10AA in a state in which the input unit 12B does not input a signal to the product operation element 10AB, the input unit 12C does not input a signal to the product operation element 10AC, the input unit 12X does not input a signal to the alternative element 10AX, and the input unit 12A inputs a signal to the product operation element 10AA. In this state, an output from the product operation element 10AB is zero, an output from the product operation element 10AC is zero, and an output from the alternative element 10AX is zero. The inspector 13 determines whether or not the product operation element 10AA has malfunctioned on the basis of the detection value of the output detector 11A.

Similarly, the inspector 13 inspects whether or not the product operation element 10AB has malfunctioned and whether or not the product operation element 10AC has malfunctioned.

In addition, in the example shown in FIGS. 1 and 2, the inspector 13 inspects whether or not each of the plurality of product operation elements 10BA, 10BB, and 10BC has malfunctioned.

To inspect whether or not the product operation element 10BB has malfunctioned, for example, the output detector 11B detects an output from the product operation element 10BB in a state in which the input unit 12A does not input a signal to the product operation element 10BA, the input unit 12C does not input a signal to the product operation element 10BC, the input unit 12X does not input a signal to the alternative element 10BX, and the input unit 12B inputs a signal to the product operation element 10BB. In this state, an output from the product operation element 10BA is zero, an output from the product operation element 10BC is zero, and an output from the alternative element 10BX is zero. The inspector 13 determines whether or not the product operation element 10BB has malfunctioned on the basis of the detection value of the output detector 11B.

Similarly, the inspector 13 inspects whether or not the product operation element 10BA has malfunctioned and whether or not the product operation element 10BC has malfunctioned.

When the inspector 13 has detected that any of the plurality of product operation elements 10AA, 10AB, and 10AC has malfunctioned, the function replacer 14 causes the alternative element 10AX to perform a product operation that the malfunctioning product operation element (for example, the product operation element 10AA) performed before malfunctioning.

The resistance value of the alternative element 10AX that performs the product operation that the malfunctioning product operation element (for example, the product operation element 10AA) performed before malfunctioning is preset to an intermediate value that is greater than a minimum value of a resistance value fluctuation range of the alternative element 10AX and smaller than a maximum value of the resistance value fluctuation range.

When the inspector 13 has detected that any of the plurality of product operation elements 10BA, 10BB, and 10BC has malfunctioned, the function replacer 14 causes the alternative element 10BX to perform a product operation that the malfunctioning product operation element (for example, the product operation element 10BB) performed before malfunctioning.

The resistance value of the alternative element 10BX that performs the product operation that the malfunctioning product operation element (for example, the product operation element 10BB) performed before malfunctioning is preset to an intermediate value that is greater than a minimum value of a resistance value fluctuation range of the alternative element 10BX and smaller than a maximum value of the resistance value fluctuation range.

In the example shown in FIG. 1, the alternative element 10AX is disposed on a side opposite to the output detector 11A (on the upper side in FIG. 1) across the plurality of product operation elements 10AA, 10AB, and 10AC. Further, the alternative element 10BX is disposed on a side opposite to the output detector 11B (on the upper side in FIG. 1) across the plurality of product operation elements 10BA, 10BB, and 10BC.

That is, FIG. 1 shows an example in which the alternative elements 10AX and 10BX are disposed on the upper side in FIG. 1, which is preferable from the viewpoint of the wiring resistance of the product-sum operation device 1 (for example, which curbs the power consumption of the product-sum operation device 1) as compared to when the alternative elements 10AX and 10BX are disposed on the lower side in FIG. 1.

Resistance change elements used as the product operation elements in the present invention are elements whose electrical resistance reversibly changes in response to an external stimulus (such as a current, a voltage, or a magnetic field). Examples of the resistance change elements include a resistance change memory (RRAM) element, a phase change memory (PCRAM) element, an anisotropic magnetoresistance effect (AMR) element, a tunnel magnetoresistance effect (TMR) element, and a giant magnetoresistance effect (GMR) element.

Specifically, in the example shown in FIGS. 1 and 3, each of the product operation elements 10AA to 10AC and 10BA to 10BC and the alternative elements 10AX and 10BX is a magnetoresistance effect element exhibiting a magnetoresistance effect. For example, the resistance values of the product operation elements 10AA to 10AC and 10BA to 10BC and the alternative elements 10AX and 10BX during normal operation and the resistance values of the product operation elements 10AA to 10AC and 10BA to 10BC and the alternative elements 10AX and 10BX during a malfunction may differ by three or more orders of magnitude.

Figure 4:
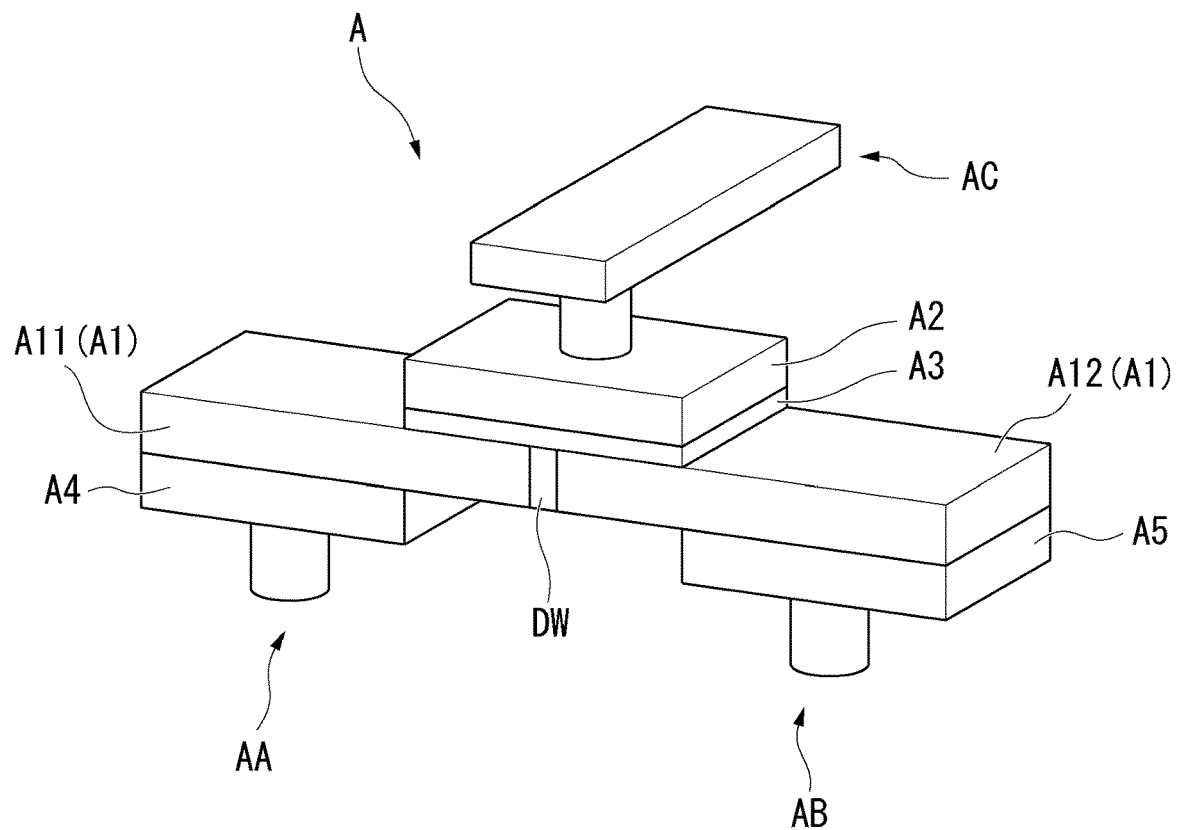
FIG. 4 is a perspective view showing an example of a magnetoresistance effect element that constitutes each of product operation elements and alternative elements of the product-sum operation device of the first embodiment.

FIG. 4 is a perspective view showing an example of a magnetoresistance effect element A that constitutes each of the product operation elements 10AA to 10AC and 10BA to 10BC and the alternative elements 10AX and 10BX of the product-sum operation device 1 of the first embodiment.

In the example shown in FIG. 4, the magnetoresistance effect element A includes a magnetization free layer A1 having a domain wall DW, a magnetization fixed layer A2 whose magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the domain wall DW and a second region A12 on the other side of the domain wall DW. The first region A11 is provided with a write terminal AA. The second region A12 is provided with a common terminal AB. The magnetization fixed layer A2 is provided with a read terminal AC.

The amount of movement (movement distance) of the domain wall DW can be variably controlled by adjusting the magnitude and duration of a write current that flows between the write terminal AA and the common terminal AB. The amount of movement (movement distance) of the domain wall DW can be set with the magnitude and duration of the write current, for example, using the number of pulses or the pulse width. When the area of a portion where the magnetization directions of the magnetization fixed layer A2 and the magnetization free layer A1 are parallel (or antiparallel) continuously changes by driving (moving) the domain wall DW, the ratio between the area proportion of the portion where the magnetization directions are parallel and the area proportion of the portion where the magnetization directions are antiparallel continuously changes, thus obtaining a nearly linear resistance change in the magnetoresistance effect element.

Further, data can be read by flowing current between the read terminal AC and the common terminal AB and detecting a resistance corresponding to the ratio between the area proportion of the portion where the magnetization directions are parallel and the area proportion of the portion where the magnetization directions are antiparallel (see, for example, Patent Document 1).

[Magnetization Fixed Layer A2]

The magnetization fixed layer A2 is a layer in which the magnetization is oriented in a first direction (for example, leftward in FIG. 4) and fixed. Here, the magnetization being fixed means that the magnetization direction does not change (the magnetization is fixed) before and after writing using a write current.

In the example shown in FIG. 4, the magnetization fixed layer A2 is an in-plane magnetization film whose magnetization has in-plane magnetic anisotropy (an in-plane easy magnetization axis). The magnetization fixed layer A2 is not limited to the in-plane magnetization film and may be a perpendicular magnetization film having perpendicular magnetic anisotropy (a perpendicular easy magnetization axis).

When the magnetization fixed layer A2 is an in-plane magnetization film, it has a high MR ratio (magnetoresistance change rate) and is hardly affected by a spin transfer torque (STT) during reading, and thus can increase the reading voltage. On the other hand, when it is desired to miniaturize the element, it is preferable to use a perpendicular magnetization film with a large magnetic anisotropy and a small demagnetizing field.

A known material can be used for the magnetization fixed layer A2. For example, a metal selected from the group consisting of Cr, Mn, Co, Fe, and Ni and an alloy that contains at least one of these metals and exhibits ferromagnetism can be used. An alloy containing these metals and at least one element of B, C, and N can also be used. Specific examples include Co—Fe and Co—Fe—B.

A Heusler alloy such as $Co_2FeSi$ can also be used for the magnetization fixed layer A2. The Heusler alloy includes an intermetallic compound having a chemical composition of $X_2YZ$, where X is a transition metal element or a noble metal element of Co, Fe, Ni or Cu groups in the periodic table, Y is a transition metal element of Mn, V, Cr or Ti groups, which may be of the same elemental species as X, and Z is a typical element of Groups III to V. Examples include $Co_2FeSi$, $Co_2MnSi$, and $Co_2Mn_{1-a}Fe_aAl_bSi_{1-b}$.

The magnetization fixed layer A2 may have a synthetic structure including a ferromagnetic layer and a nonmagnetic layer or a synthetic structure including an antiferromagnetic layer, a ferromagnetic layer, and a nonmagnetic layer. In the latter, the magnetization direction of the magnetization fixed layer A2 is strongly held by the antiferromagnetic layer in the synthetic structure. Therefore, the magnetization of the magnetization fixed layer A2 is hardly affected by the outside.

When the magnetization of the magnetization fixed layer A2 is oriented in the XY plane (the magnetization fixed layer A2 is an in-plane magnetization film), it is preferable to use, for example, NiFe. On the other hand, when the magnetization of the magnetization fixed layer A2 is oriented in the Z direction (the magnetization fixed layer A2 is a perpendicular magnetization film), it is preferable to use, for example, a Co/Ni laminated film or a Co/Pt laminated film. For example, when the magnetization fixed layer A2 is made of [Co(0.24 nm)/Pt(0.16 nm)]6/Ru(0.9 nm)/[Pt(0.16 nm)/Co(0.16 nm)]4/Ta(0.2 nm)/FeB(1.0 nm), this forms a perpendicular magnetization film.

[Nonmagnetic Layer A3]

The nonmagnetic layer A3 is disposed on a lower surface of the magnetization fixed layer A2. In the magnetoresistance effect element A, a change in the magnetization state of the magnetization free layer A1 with respect to the magnetization fixed layer A2 is read as a change in resistance value via the nonmagnetic layer A3. That is, the magnetization fixed layer A2, the nonmagnetic layer A3, and the magnetization free layer A1 function as the magnetoresistance effect element A. When the nonmagnetic layer A3 is made of an insulator, the configuration is similar to that of the tunnel magnetoresistance (TMR) element. When the nonmagnetic layer 2 is made of a metal, the configuration is similar to that of a giant magnetoresistance effect (GMR) element.

A known material that can be used for the nonmagnetic layer of the magnetoresistance effect element A can be used as a material of the nonmagnetic layer A3. When the nonmagnetic layer A3 is made of an insulator (i.e., when it is a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayer film or a mixed composition film of these materials, or the like can be used as a material of the nonmagnetic layer A3. Besides these materials, a material in which a part of Al, Si, or Mg is substituted with Zn, Be, or the like can also be used. Among these, MgO and $MgAl_2O_4$ can have a large magnetoresistance ratio (MR ratio) since these are materials capable of realizing coherent tunneling. On the other hand, when the nonmagnetic layer 2 is made of a metal, Cu, Al, Ag, or the like can be used as a material of the nonmagnetic layer A3.

When the nonmagnetic layer A3 is made of an insulator (i.e., when it is a tunnel barrier layer), the thickness thereof is, for example, 2.5 nm or more.

[Magnetization Free Layer A1]

The magnetization free layer A1 corresponds to a domain wall drive layer of a domain wall drive type (motion type) MRAM.

The magnetization free layer A1 is made of a ferromagnetic material and the magnetization direction inside thereof can be reversed. The magnetization free layer A1 has a first region A11 in which the magnetization is oriented in a second direction opposite to that of the magnetization fixed layer A2, a second region A12 in which the magnetization is oriented in the same direction as the first direction, and a domain wall DW that forms the interface between these regions. The magnetization directions of the first region A11 and the second region A12 are opposite to each other across the domain wall DW. The domain wall DW is moved by changing the composition ratio of the first region A11 and the second region A12 in the magnetization free layer A1.

A known material can be used as a material of the magnetization free layer A1 and in particular a soft magnetic material can be applied. For example, a metal selected from the group consisting of Cr, Mn, Co, Fe, and Ni, an alloy containing at least one of these metals, an alloy containing these metals and at least one element of B, C, and N, or the like can be used. Specific examples of the material for the magnetization free layer A1 include Co—Fe, Co—Fe—B, and Ni—Fe.

A material having a small saturation magnetization can be used as a material of the magnetization free layer A1. For example, when a material having a small saturation magnetization such as (MnGa)As or (InFe)As or a Co/Tb multilayer film or GdFeCo is used, the domain wall DW of the magnetization free layer A1 can be driven with a small current density. Moreover, when these materials are used, the drive speed of the domain wall DW becomes slow.

A material with weak magnetic anisotropy such as NiFe gives a high drive speed to the domain wall DW and allows the domain wall DW to operate at a speed of 100 m/sec or more. That is, the domain wall DW moves a distance of 1 μm with a pulse of 10 nsec. Accordingly, to move the magnetization free layer A1 in an analog manner in the element, it is necessary to take measures such as applying a minute pulse using an expensive semiconductor circuit or making the magnetization free layer sufficiently long at the expense of the degree of integration. On the other hand, a material with a slow drive speed for the domain wall DW can form an analog memory even when a sufficiently long pulse current is applied or when the length of the magnetization free layer A1 is short.

When the magnetization free layer A1 is a perpendicular magnetization film, it is preferable that a perpendicular magnetization film selected from the group consisting of a Co/Pt multilayer film, a Co/Pd multilayer film, and a CoCrPt alloy film be used. A perpendicular magnetization film of $Mn_3X$ (X=Ga, Ge) or a perpendicular magnetization film using a multilayer film of Co/Ni or the like can also be used. These materials allow the domain wall DW to be driven even when the current density for driving the domain wall is small.

It is preferable that the extension length of the magnetization free layer A1 in the longitudinal direction be 60 nm or more. If the extension length of the magnetization free layer A1 is less than 60 nm, it tends to form a single magnetic domain and a domain wall DW is hardly formed in the magnetization free layer A1.

The thickness of the magnetization free layer A1 is not particularly limited as long as it functions as a domain wall drive layer, and may be, for example, 2 to 60 nm. When the thickness of the magnetization free layer A1 is 60 nm or more, the possibility that a domain wall is formed in the stacking direction increases. However, whether or not a domain wall is formed in the stacking direction depends on a balance with the shape anisotropy of the magnetization free layer A1. If the thickness of the magnetization free layer A1 is less than 60 nm, it is unlikely that such a domain wall DW will be formed in the stacking direction.

The magnetization free layer A1 may have a domain wall pinning portion which stops movement of the domain wall DW on a side of the layer. For example, by providing irregularities, a groove, a bulge, a constriction, a cutout, or the like at a position where it is desired to stop the movement of the domain wall DW of the magnetization free layer A1, it is possible to stop (pin) the movement of the domain wall. When the magnetization free layer A1 has a domain wall pinning portion, this can be configured such that the domain wall no longer moves unless a current of a threshold value or more flows, and the output signal is not analog and can be easily multi-valued.

For example, by forming domain wall pinning portions at intervals of a predetermined distance, the domain wall DW can be held more stably, enabling stable multi-valued recording and also enabling more stable reading of multi-valued output signals.

In the example shown in FIG. 4, in order to form the domain wall DW, a first magnetization supply layer A4 having a magnetization in the first direction which is the same as the magnetization of the first region A11 and a second magnetization supply layer A5 having a magnetization in the second direction which is the same as the magnetization of the second region A12 are formed on both end portions of the magnetization free layer A1 that do not overlap the magnetization fixed layer A2 in plan view.

The same material as the ferromagnetic material that can be used for the magnetization fixed layer A2 can be used as a material of the first magnetization supply layer A4 and the second magnetization supply layer A5.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a spin orbit torque (SOT) wiring that is in contact with the magnetization free layer A1 and extends in a direction crossing the longitudinal direction of the magnetization free layer A1 may also be used for one or both end portions. The spin orbit torque wiring is made of a material that generates a pure spin current by the spin Hall effect when a current flows.

With this configuration, a domain wall can be introduced into the magnetization free layer A1 by flowing a current through both ends of the spin orbit torque wiring without providing a magnetization supply layer as a layer with fixed magnetization. The domain wall can be moved by flowing a current through the magnetization free layer A1 via the spin orbit torque wiring.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a magnetic field application wiring that is electrically insulated from the magnetization free layer A1 and extends in a direction crossing the magnetization free layer A1 may be used for one or both end portions. A magnetic field is generated by Ampere's law by flowing a current through the magnetic field application wiring. The direction of the generated magnetic field can be reversed with the direction of the current flowing through the magnetic field application wiring. Therefore, by disposing a magnetic field application wiring capable of supplying an in-plane magnetization to an end portion of the magnetization free layer A1, an in-plane magnetization with one of the in-plane magnetization directions that are opposite to each other can be supplied to the end portion of the magnetization free layer A1 according to the direction of a current flowing through the magnetic field application wiring. In addition, by disposing a magnetic field application wiring capable of supplying a perpendicular magnetization to an end portion of the magnetization free layer A1, a perpendicular magnetization with one of the perpendicular magnetization directions that are opposite to each other can be supplied to the end portion of the magnetization free layer A1 according to the direction of a current flowing through the magnetic field application wiring.

In the example shown in FIG. 4, in order to form the domain wall DW, the first magnetization supply layer A4 and the second magnetization supply layer A5 are used as layers whose magnetizations are fixed in both end portions of the magnetization free layer A1. However, a voltage application terminal that is connected to the magnetization free layer A1 via an insulating layer may be used for one or both end portions. When a voltage is applied between the magnetization fixed layer A2 and the voltage application terminal, a part of the magnetization of the magnetization free layer A1 is affected by the voltage. For example, when a voltage is applied as a pulse from the voltage application terminal, a part of the magnetization is oriented in a direction perpendicular to the magnetization direction of the magnetization free layer A1 during the voltage application and the magnetization of the magnetization free layer A1 is oriented in a first direction or a second direction opposite thereto when the voltage application has stopped. The magnetization oriented in the perpendicular direction falls into the first direction or the second direction opposite thereto with equal probabilities. Thus, by adjusting the timing, the number of times, and the period of applying the pulsed voltage, a part of the magnetization can become oriented into the second direction from the first direction.

A magnetic coupling layer may be provided between the magnetization free layer A1 and the nonmagnetic layer A3. The magnetic coupling layer is a layer that transfers the magnetization state of the magnetization free layer A1. A main function of the magnetization free layer A1 is being a layer for driving the domain wall and it is not always possible to select a material suitable for the magnetoresistance effect generated through the magnetization fixed layer A2 and the magnetization free layer A1 sandwiching the nonmagnetic layer A3. In general, it is known that a ferromagnetic material having a BCC structure is good for the magnetization fixed layer A2 and the magnetic coupling layer to generate a coherent tunnel effect at the nonmagnetic layer A3. In particular, it is known that a large output can be obtained when a material having a composition of Co—Fe—B is formed through sputtering as a material of the magnetization fixed layer A2 and the magnetic coupling layer.

Figure 5:
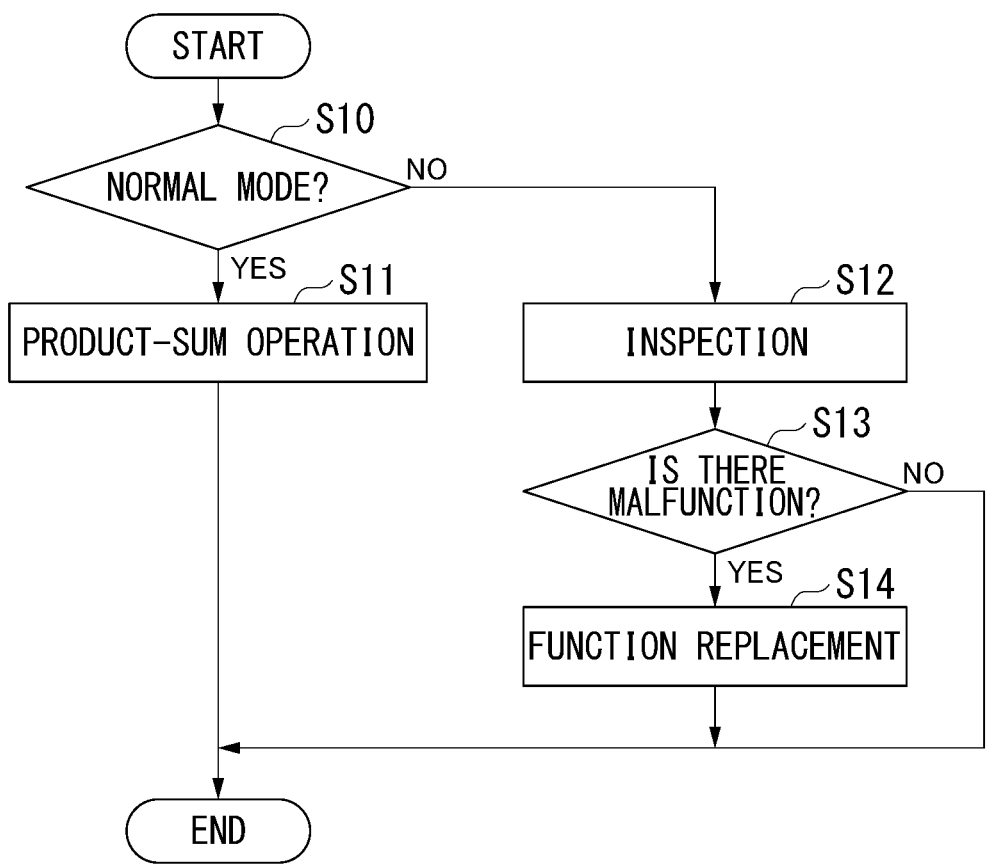
FIG. 5 is a flowchart showing an example of a process executed by the product-sum operation device of the first embodiment.

FIG. 5 is a flowchart showing an example of a process executed by the product-sum operation device 1 of the first embodiment.

In the example shown in FIG. 5, the product-sum operation device 1 has a normal mode in which a normal product-sum operation is performed by the product operator 10 and the sum operator 11 and an inspection mode in which inspection or the like of the product operation elements 10AA to 10AC and 10BA to 10BC is performed by the inspector 13.

In step S10, the product-sum operation device 1 determines whether the product-sum operation device 1 is in the normal mode or the inspection mode. When the product-sum operation device 1 is in the normal mode, the process proceeds to step S11. When the product-sum operation device 1 is in the inspection mode, the process proceeds to step S12.

In step S11, the product operator 10 and the sum operator 11 perform a normal product-sum operation.

In step S12, the inspector 13 inspects the product operation elements 10AA to 10AC and 10BA to 10BC. Specifically, as described above, the inspector 13 performs an inspection as to whether or not the product operation element 10AA has malfunctioned, an inspection as to whether or not the product operation element 10AB has malfunctioned, an inspection as to whether or not the product operation element 10AC has malfunctioned, an inspection as to whether or not the product operation element 10BA has malfunctioned, an inspection as to whether or not the product operation element 10BB has malfunctioned, and an inspection as to whether or not the product operation element 10BC has malfunctioned.

Next, in step S13, for example, the function replacer 14 determines whether or not any of the product operation elements 10AA to 10AC and 10BA to 10BC has malfunctioned on the basis of the inspection result of the inspector 13. When any of the product operation elements 10AA to 10AC and 10BA to 10BC has malfunctioned, the process proceeds to step S14. When the product operation elements 10AA to 10AC and 10BA to 10BC are all normal, the routine shown in FIG. 5 ends.

In step S14, the function replacer 14 replaces functions of the malfunctioning product operation elements with those of the alternative elements 10AX and 10BX. That is, the function replacer 14 causes the alternative elements 10AX and 10BX to perform product operations that the malfunctioning product operation elements performed before malfunctioning.

For example, when the inspector 13 has determined that the product operation element 10AA has malfunctioned, the function replacer 14 causes the alternative element 10AX to perform a product operation that the malfunctioning product operation element 10AA performed before malfunctioning. Specifically, for example, the function replacer 14 changes the resistance value of the alternative element 10AX from the intermediate value described above to the resistance value of the product operation element 10AA before malfunctioning.

For example, the resistance value of the product operation element 10AA before malfunctioning is stored in a storage unit (not shown). The function replacer 14 reads the resistance value from the storage unit and changes the resistance value of the alternative element 10AX to the read resistance value.

Similarly, when the inspector 13 has determined that the product operation element 10AB has malfunctioned, the function replacer 14 causes the alternative element 10AX to perform a product operation that the malfunctioning product operation element 10AB performed before malfunctioning. When the inspector 13 has determined that the product operation element 10AC has malfunctioned, the function replacer 14 causes the alternative element 10AX to perform a product operation that the malfunctioning product operation element 10AC performed before malfunctioning.

Also, for example, when the inspector 13 has determined that the product operation element 10BA has malfunctioned, the function replacer 14 causes the alternative element 10BX to perform a product operation that the malfunctioning product operation element 10BA performed before malfunctioning. Specifically, for example, the function replacer 14 changes the resistance value of the alternative element 10BX from the intermediate value described above to the resistance value of the product operation element 10BA before malfunctioning.

Similarly, when the inspector 13 has determined that the product operation element 10BB has malfunctioned, the function replacer 14 causes the alternative element 10BX to perform a product operation that the malfunctioning product operation element 10BB performed before malfunctioning. When the inspector 13 has determined that the product operation element 10BC has malfunctioned, the function replacer 14 causes the alternative element 10BX to perform a product operation that the malfunctioning product operation element 10BC performed before malfunctioning.

Figure 6:
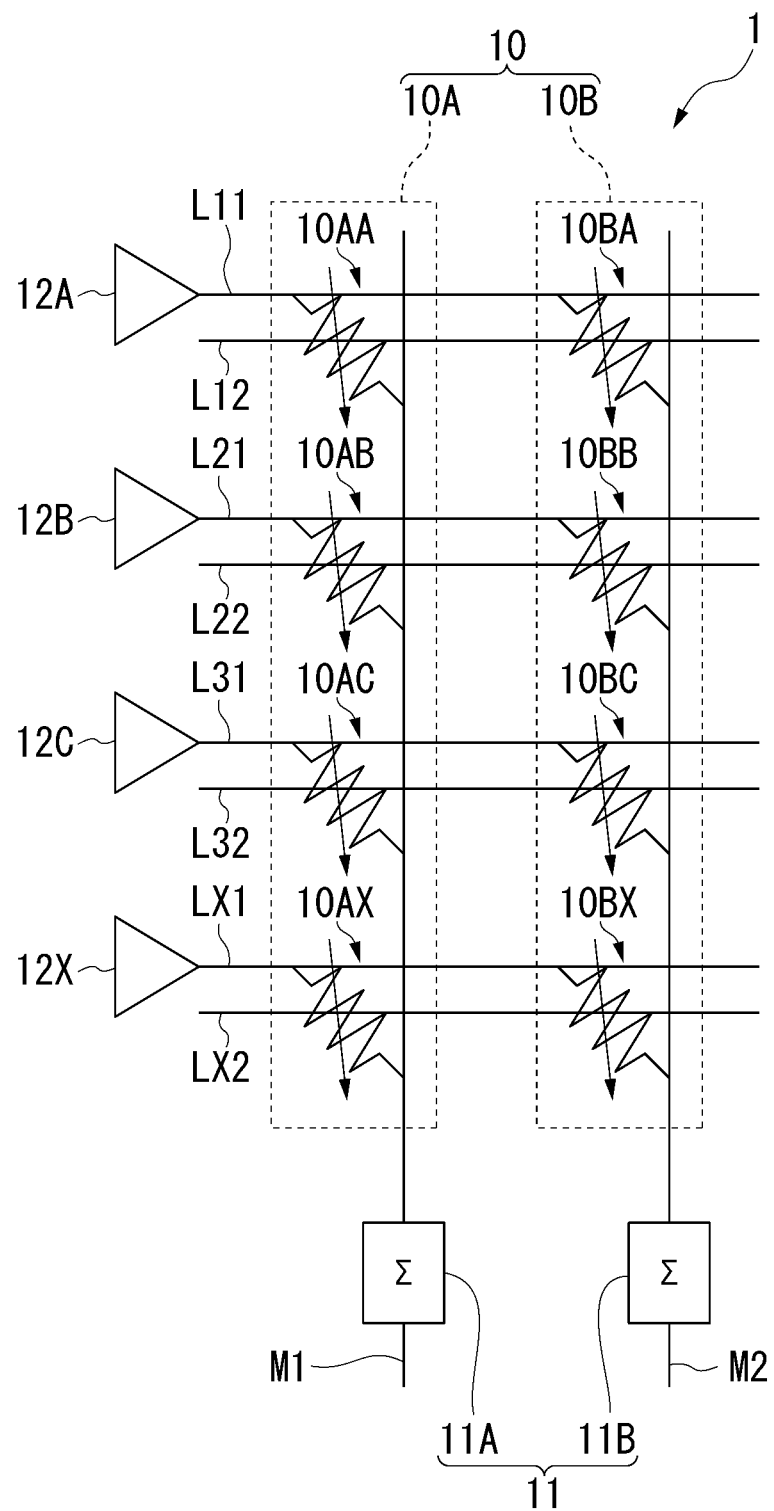
FIG. 6 is a diagram showing a second example of a partial configuration of the product-sum operation device of the first embodiment.

FIG. 6 is a diagram showing a second example of a partial configuration of the product-sum operation device 1 of the first embodiment.

In the example shown in FIG. 1, as described above, the alternative element 10AX is disposed on a side opposite to the output detector 11A (on the upper side in FIG. 1) across the plurality of product operation elements 10AA, 10AB, and 10AC, and the alternative element 10BX is disposed on a side opposite to the output detector 11B (on the upper side in FIG. 1) across the plurality of product operation elements 10BA, 10BB, and 10BC.

On the other hand, in the example shown in FIG. 6, an output detector 11A is disposed on a side opposite to a plurality of product operation elements 10AA, 10AB, and 10AC (on the lower side in FIG. 6) across an alternative element 10AX and an output detector 11B is disposed on a side opposite to a plurality of product operation elements 10BA, 10BB, and 10BC (on the lower side in FIG. 6) across an alternative element 10BX.

That is, FIG. 6 shows an example in which the alternative elements 10AX and 10BX are disposed on the lower side in FIG. 6, which is preferable from the viewpoint of the wiring resistance of the product-sum operation device 1 (for example, which curbs the power consumption of the product-sum operation device 1) as compared to when the alternative elements 10AX and 10BX are disposed on the upper side in FIG. 6.

Figure 7:
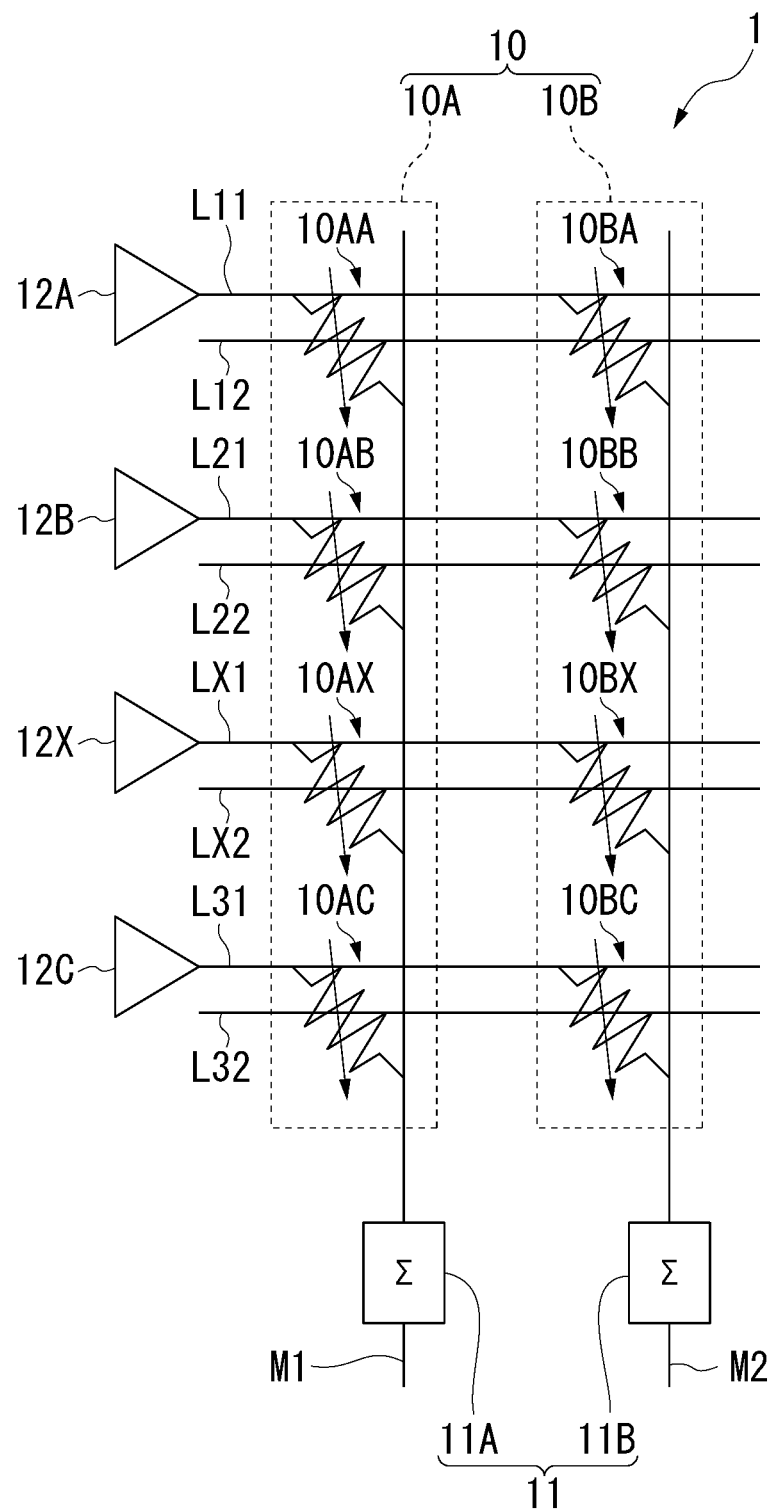
FIG. 7 is a diagram showing a third example of a partial configuration of the product-sum operation device of the first embodiment.

FIG. 7 is a diagram showing a third example of a partial configuration of the product-sum operation device 1 of the first embodiment.

In the example shown in FIG. 7, an alternative element 10AX is disposed between a product operation element 10AA and a product operation element 10AC among a plurality of product operation elements 10AA, 10AB, and 10AC, and an alternative element 10BX is disposed between a product operation element 10BA and a product operation element 10BC among a plurality of product operation elements 10BA, 10BB, and 10BC.

That is, FIG. 7 shows an example in which the alternative element 10AX is disposed between the plurality of product operation elements 10AA to 10AC and the alternative element 10BX is disposed between the plurality of product operation elements 10BA to 10BC, which is preferable from the viewpoint of the wiring resistance of the product-sum operation device 1 (for example, which curbs the power consumption of the product-sum operation device 1) as compared to when the alternative elements 10AX and 10BX are disposed at an upper end or a lower end of FIG. 7 (specifically, disposed between the product operation elements 10AC and 10BC and the output detectors 11A and 11B).

Figure 8:
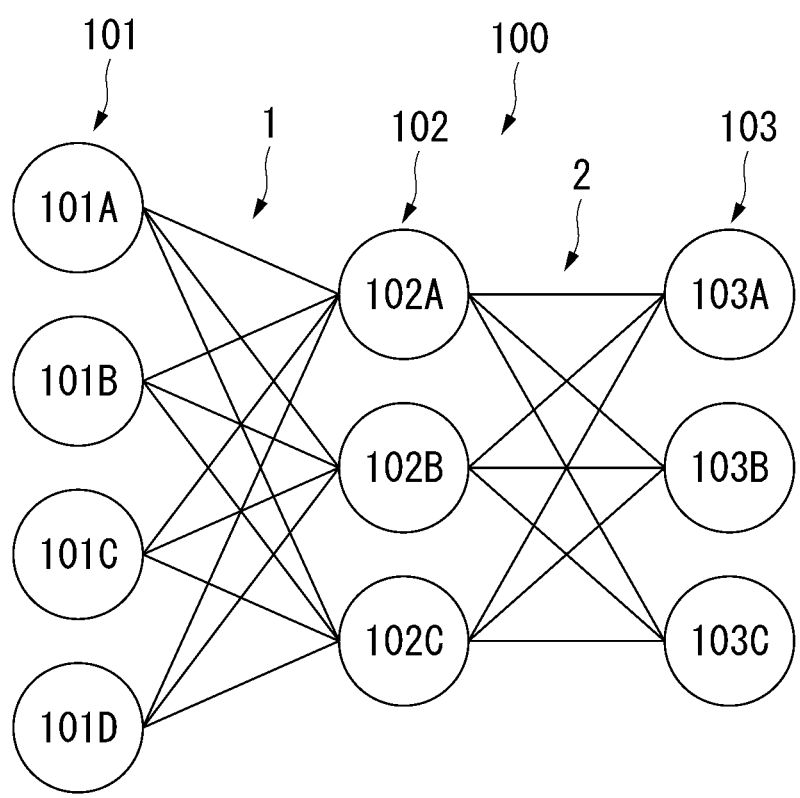
FIG. 8 is a diagram showing an exemplary application of the product-sum operation device of the first embodiment.

FIG. 8 is a diagram showing an exemplary application of the product-sum operation device 1 of the first embodiment.

In the example shown in FIG. 8, the product-sum operation device 1 of the first embodiment is applied to a neuromorphic device 100. The neuromorphic device 100 includes an input layer 101, a hidden layer 102, an output layer 103, the product-sum operation device 1 of the first embodiment, and a product-sum operation device 2. The product-sum operation device 2 includes a plurality of product operation elements, similar to the product-sum operation device 1 of the first embodiment shown in FIG. 1, 6 or 7.

The input layer 101 includes, for example, four nodes 101A, 101B, 101C, and 101D. The hidden layer 102 includes, for example, three nodes 102A, 102B, and 102C. The output layer 103 includes, for example, three nodes 103A, 103B, and 103C.

The product-sum operation device 1 is disposed between the input layer 101 and the hidden layer 102 and connects the four nodes 101A, 101B, 101C, and 101D of the input layer 101 and the three nodes 102A, 102B, and 102C of the hidden layer 102. The product-sum operation device 1 changes weights by changing the resistance values of the product operation elements 10AA to 10AC and 10BA to 10BC shown in FIG. 1, 6 or 7.

The product-sum operation device 2 is disposed between the hidden layer 102 and the output layer 103. The product-sum operation device 2 connects the three nodes 102A, 102B, and 102C of the hidden layer 102 and the three nodes 103A, 103B, and 103C of the output layer 103. The product-sum operation device 2 changes weights by changing the resistance values of the plurality of product operation elements.

The hidden layer 102 uses an activation function (for example, a sigmoid function).

In intensive studies, the present inventor has found that the functions of the neuromorphic device 100 deteriorate if the characteristics of the product operation elements 10AA to 10AC and 10BA to 10BC constituting the product-sum operation device 1 change for some reason (specifically, if the product operation elements 10AA to 10AC and 10BA to 10BC malfunction).

Therefore, in the product-sum operation device 1 of the first embodiment, the alternative elements 10AX and 10BX which, when any of the plurality of product operation elements 10AA to 10AC and 10BA to 10BC has malfunctioned, are used instead of the malfunctioning product operation elements are provided as described above.

Therefore, in the product-sum operation device 1 of the first embodiment, when any of the plurality of product operation elements 10AA to 10AC and 10BA to 10BC has malfunctioned, the alternative elements 10AX and 10BX are caused to perform product operations that the malfunctioning product operation elements performed before malfunctioning, whereby it is possible to curb the functional deterioration of the neuromorphic device 100 as compared to when the alternative elements 10AX and 10BX are not provided.

Specifically, when the product-sum operation device 1 of the first embodiment is used, the inspector 13 determines whether or not each of the product operation elements 10AA to 10AC has malfunctioned on the basis of outputs from the product operation elements 10AA to 10AC detected by the output detector 11A and the inspector 13 determines whether or not each of the product operation elements 10BA to 10BC has malfunctioned on the basis of outputs from the product operation elements 10BA to 10BC detected by the output detector 11B as described above.

Therefore, according to the product-sum operation device 1 of the first embodiment, it is possible to detect malfunctions of the product operation elements 10AA to 10AC and 10BA to 10BC not only in the manufacturing stage of the product-sum operation device 1 but also when the product-sum operation device 1 is used.

In the product-sum operation device 1 of the first embodiment, when the inspector 13 has detected that any of the product operation elements 10AA to 10AC and 10BA to 10BC has malfunctioned, the function replacer 14 causes the alternative elements 10AX and 10BX to perform product operations that the malfunctioning product operation elements performed before malfunctioning as described above.

Therefore, according to the product-sum operation device 1 of the first embodiment, even when any of the product operation elements 10AA to 10AC and 10BA to 10BC has malfunctioned, it is possible to cause the product-sum operation device 1 to continue to operate normally and it is also possible to maintain the performance of a neural network when the product-sum operation device 1 of the first embodiment is applied to the neural network.

Further, in the product-sum operation device 1 of the first embodiment, the resistance values of the alternative elements 10AX and 10BX that perform product operations that the malfunctioning product operation elements performed before malfunctioning are preset to an intermediate value that is greater than the minimum value of the resistance value fluctuation range of the alternative elements 10AX and 10BX and smaller than the maximum value of the resistance value fluctuation range as described above.

Therefore, according to the product-sum operation device 1 of the first embodiment, the time required to change the resistance values of the alternative elements 10AX and 10BX from the intermediate value described above to the resistance values of the product operation elements before malfunctioning can be reduced on average.

Furthermore, in the product-sum operation device 1 of the first embodiment, as described above, each of the product operation elements 10AA to 10AC and 10BA to 10BC and the alternative elements 10AX and 10BX is a magnetoresistance effect element A that has a write terminal AA, a common terminal AB, and a read terminal AC and exhibits a magnetoresistance effect. The magnetoresistance effect element A includes a magnetization free layer A1 having a domain wall DW, a magnetization fixed layer A2 whose magnetization direction is fixed, and a nonmagnetic layer A3 sandwiched between the magnetization free layer A1 and the magnetization fixed layer A2.

That is, in the product-sum operation device 1 of the first embodiment, elements with a great difference between the resistance value during normal operation and the resistance value during a malfunction (specifically, during an output current increase malfunction) are used as the product operation elements 10AA to 10AC and 10BA to 10BC.

Therefore, according to the product-sum operation device 1 of the first embodiment, it is possible to accurately detect a malfunction that may greatly impair the performance of the neural network as compared to when elements with a small difference between the resistance value during normal operation and the resistance value during a malfunction (specifically, during an output current increase malfunction) are used.

In the above example, when any of the product operation elements 10AA, 10AB, and 10AC has malfunctioned during use of the product-sum operation device 1 of the first embodiment, the alternative element 10AX is used instead of the malfunctioning product operation element. When any of the product operation elements 10BA, 10BB, and 10BC has malfunctioned during use of the product-sum operation device 1, the alternative element 10BX is used instead of the malfunctioning product operation element.

In another example, when a malfunction (defect) of any of the product operation elements 10AA, 10AB, and 10AC is found during manufacture of the product-sum operation device 1 of the first embodiment, the alternative element 10AX may be used instead of the malfunctioning (defective) product operation element, and when a malfunction (defect) of any of the product operation elements 10BA, 10BB, and 10BC is found during manufacture of the product-sum operation device 1, the alternative element 10BX may be used instead of the malfunctioning (defective) product operation element.

<Second Embodiment> (where Resistance Change Elements are General Variable Resistors)

Hereinafter, a second embodiment of the product-sum operation device of the present invention will be described.

The product-sum operation device 1 of the second embodiment is configured similar to the product-sum operation device 1 of the first embodiment described above, except for the points described below. Therefore, according to the product-sum operation device 1 of the second embodiment, the same effects as those of the product-sum operation device 1 of the first embodiment described above can be obtained except for the points described below.

Figure 9:
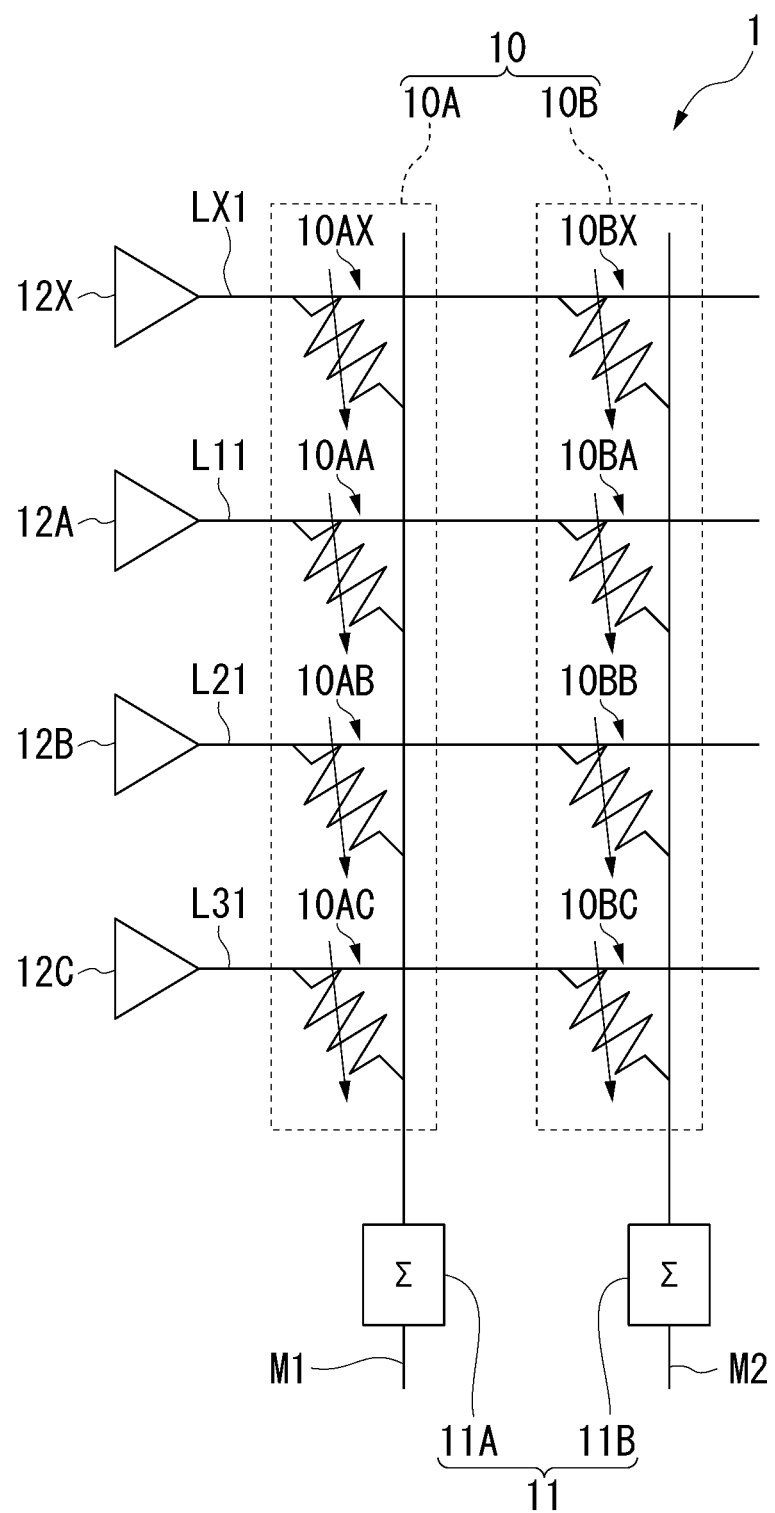
FIG. 9 is a diagram showing an example of a partial configuration of a product-sum operation device of a second embodiment.

FIG. 9 is a diagram showing an example of a partial configuration of the product-sum operation device 1 of the second embodiment.

In the product-sum operation device 1 of the first embodiment, the product operation elements 10AA to 10AC and 10BA to 10BC and the alternative elements 10AX and 10BX are constituted by magnetoresistance effect elements. On the other hand, in the product-sum operation device 1 of the second embodiment, product operation elements 10AA to 10AC and 10BA to 10BC and alternative elements 10AX and 10BX are constituted by general resistance change elements (variable resistors).

Specifically, in the example shown in FIG. 1, each of the product operation elements 10AA to 10AC and 10BA to 10BC and the alternative elements 10AX and 10BX has a read terminal, a write terminal, and a common terminal. On the other hand, in the example shown in FIG. 9, each of the product operation elements 10AA to 10AC and 10BA to 10BC and the alternative elements 10AX and 10BX has a first terminal and a second terminal.

In the example shown in FIG. 9, the first terminals of the product operation elements 10AA and 10BA are connected to a line L11. The first terminals of the product operation elements 10AB and 10BB are connected to a line L21. The first terminals of the product operation elements 10AC and 10BC are connected to a line L31. The first terminals of the alternative elements 10AX and 10BX are connected to a line LX1.

The second terminals of the product operation elements 10AA to 10AC and the alternative element 10AX are connected to a line M1. The second terminals of the product operation elements 10BA to 10BC and the alternative element 10BX are connected to a line M2.

A sum operator 11 includes an output detector 11A that detects the sum of outputs from the second terminals of the product operation elements 10AA to 10AC when the alternative element 10AX is not used and an output detector 11B that detects the sum of outputs from the second terminals of the product operation elements 10BA to 10BC when the alternative element 10BX is not used.

<Third Embodiment> (Spare Column)

Hereinafter, a third embodiment of the product-sum operation device of the present invention will be described.

The product-sum operation device 1 of the third embodiment is configured similar to the product-sum operation device 1 of the first embodiment described above, except for the points described below. Therefore, according to the product-sum operation device 1 of the third embodiment, the same effects as those of the product-sum operation device 1 of the first embodiment described above can be obtained except for the points described below.

Figure 10:
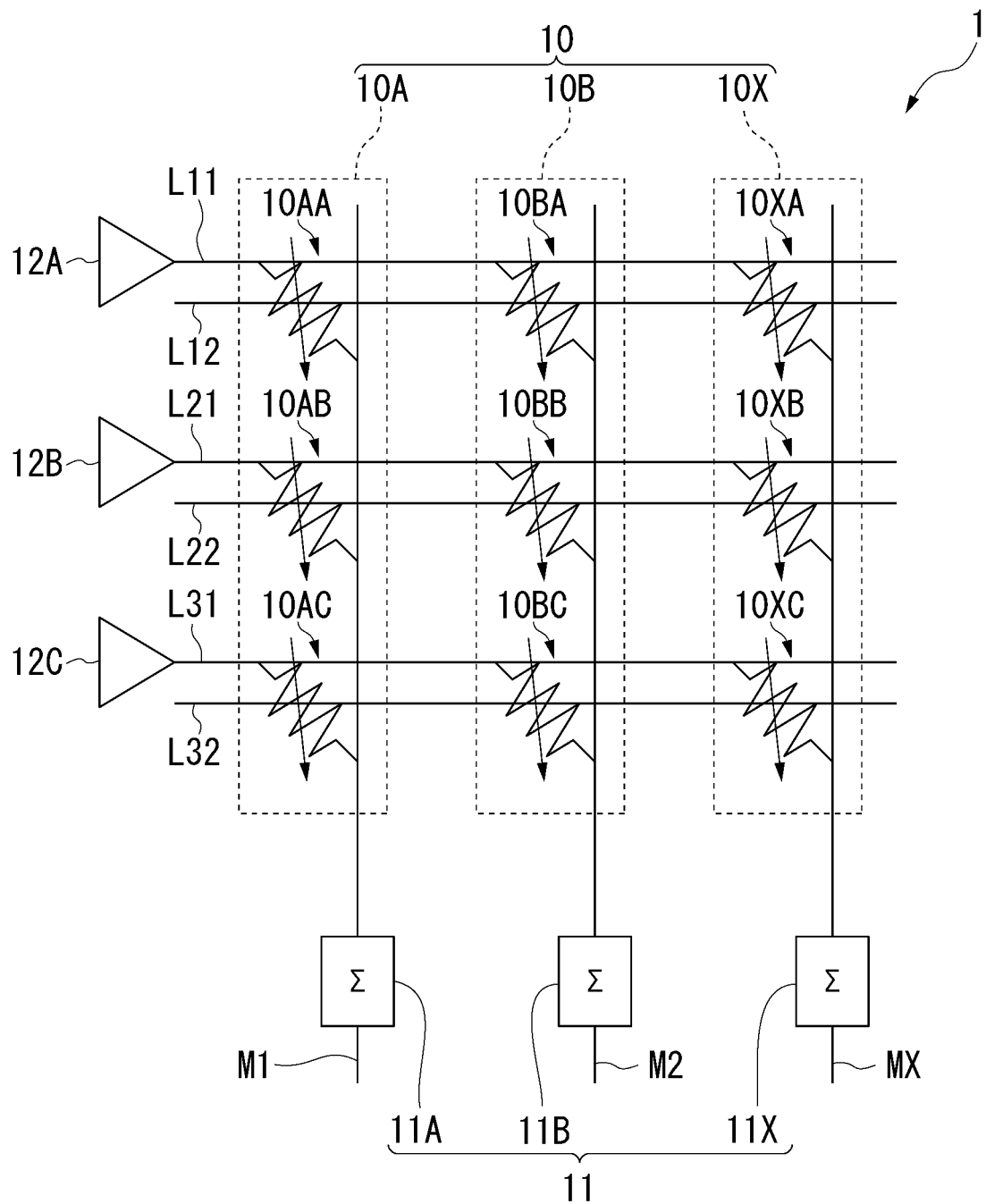
FIG. 10 is a diagram showing an example of a partial configuration of a product-sum operation device of a third embodiment.

FIG. 10 is a diagram showing an example of a partial configuration of the product-sum operation device 1 of the third embodiment.

While the product operator 10 does not include a spare column in the example shown in FIG. 1, the product operator 10 includes a spare column 10X in the example shown in FIG. 10.

In the example shown in FIG. 10, the spare column 10X includes a product operation alternative element 10XA, a product operation alternative element 10XB, and a product operation alternative element 10XC. The spare column 10X is used instead of the column 10A when any of product operation elements 10AA to 10AC of the column 10A has malfunctioned. The spare column 10X is also used instead of the column 10B when any of product operation elements 10BA to 10BC in the column 10B has malfunctioned.

In the example shown in FIG. 10, each of the plurality of product operation alternative elements 10XA to 10XC is a resistance change element having a read terminal, a write terminal, and a common terminal, similar to the product operation elements 10AA to 10AC and 10BA to 10BC.

The read terminal of the product operation alternative element 10XA is connected to a line L11. The line L11 is connected to an input unit 12A that inputs a signal to the product operation elements 10AA and 10BA and the product operation alternative element 10XA. The write terminal of the product operation alternative element 10XA is connected to a line L12.

The read terminal of the product operation alternative element 10XB is connected to a line L21. The line L21 is connected to an input unit 12B that inputs a signal to the product operation elements 10AB and 10BB and the product operation alternative element 10XB. The write terminal of the product operation alternative element 10XB is connected to a line L22.

The read terminal of the product operation alternative element 10XC is connected to a line L31. The line L31 is connected to an input unit 12C that inputs a signal to the product operation elements 10AC and 10BC and the product operation alternative element 10XC. The write terminal of the product operation alternative element 10XC is connected to a line L32.

The common terminals of the product operation alternative elements 10XA, 10XB, and 10XC are connected to a line MX.

That is, while the input unit 12X and the lines LX1 and LX2 are disposed in the example shown in FIG. 1, the input unit 12X and the lines LX1 and LX2 are not disposed in the example shown in FIG. 10.

In the example shown in FIG. 10, a sum operator 11 includes an output detector 11A, an output detector 11B, and an alternative output detector 11X. The alternative output detector 11X is disposed on the line MX. The alternative output detector 11X detects the sum of outputs from the product operation alternative elements 10XA, 10XB, and 10XC.

When the product operation elements 10AA to 10AC of the column 10A are all normal and the product operation elements 10BA to 10BC of the column 10B are all normal, the product operation alternative elements 10XA to 10XC of the spare column 10X are not used.

For example, when any of the product operation elements 10AA to 10AC in the column 10A has malfunctioned, the spare column 10X is used instead of the column 10A. Specifically, the product operation alternative elements 10XA to 10XC of the spare column 10X are used instead of the product operation elements 10AA to 10AC of the column 10A.

Also, when any of the product operation elements 10BA to 10BC in the column 10B has malfunctioned, the spare column 10X is used instead of the column 10B. Specifically, the product operation alternative elements 10XA to 10XC in the spare column 10X are used instead of the product operation elements 10BA to 10BC in the column 10B.

Specifically, in the product-sum operation device 1 of the third embodiment, when the inspector 13 (see FIG. 2) has detected that any of the plurality of product operation elements 10AA, 10AB, and 10AC has malfunctioned, the function replacer 14 (see FIG. 2) causes the plurality of product operation alternative elements 10XA, 10XB, and 10XC to perform product operations that the plurality of product operation elements 10AA, 10AB, and 10AC performed before malfunctioning. In this case, the function replacer 14 sets the resistance values of the plurality of product operation alternative elements 10XA, 10XB, and 10XC to values equal to the resistance values of the plurality of product operation elements 10AA, 10AB, and 10AC before malfunctioning.

Also, when the inspector 13 has detected that any of the plurality of product operation elements 10BA, 10BB, and 10BC has malfunctioned, the function replacer 14 (see FIG. 2) causes the plurality of product operation alternative elements 10XA, 10XB, and 10XC to perform product operations that the plurality of product operation elements 10BA, 10BB, and 10BC performed before malfunctioning. In this case, the function replacer 14 sets the resistance values of the plurality of product operation alternative elements 10XA, 10XB, and 10XC to values equal to the resistance values of the plurality of product operation elements 10BA, 10BB, and 10BC before malfunctioning.

In the example shown in FIG. 10, the product operator 10 includes one spare column 10X. However, in another example, the product operator 10 may include any number of spare columns equal to or greater than two.

Figure 11:
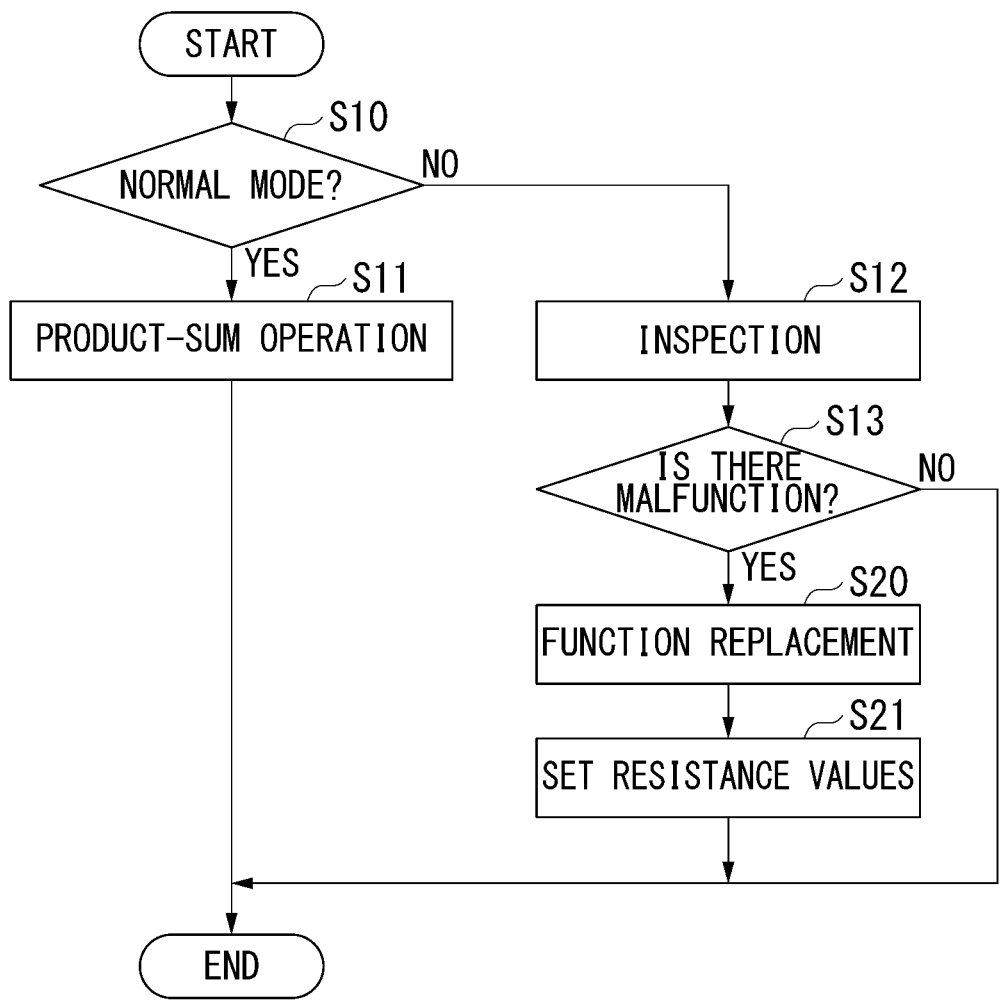
FIG. 11 is a flowchart showing an example of a process executed by the product-sum operation device of the third embodiment.

FIG. 11 is a flowchart showing an example of a process executed by the product-sum operation device 1 of the third embodiment.

In the example shown in FIG. 11, the product-sum operation device 1 has a normal mode in which a normal product-sum operation is performed by the product operator 10 and the sum operator 11 and an inspection mode in which inspection or the like of the product operation elements 10AA to 10AC and 10BA to 10BC is performed by the inspector 13.

In step S10, the product-sum operation device 1 executes the same process as step S10 of FIG. 5.

In step S11, the product operator 10 and the sum operator 11 execute the same process as step S11 of FIG. 5.

In step S12, the inspector 13 executes the same process as step S12 of FIG. 5.

Next, in step S13, for example, the function replacer 14 executes the same process as step S13 of FIG. 5. When any of the product operation elements 10AA to 10AC and 10BA to 10BC has malfunctioned, the process proceeds to step S20. When the product operation elements 10AA to 10AC and 10BA to 10BC are all normal, the routine shown in FIG. 11 ends.

In step S20, when any of the product operation elements 10AA to 10AC has malfunctioned, the function replacer 14 causes the plurality of product operation alternative elements 10XA, 10XB, and 10XC to perform product operations that the plurality of product operation elements 10AA, 10AB, and 10AC performed before malfunctioning. When any of the product operation elements 10BA to 10BC has malfunctioned, the function replacer 14 causes the plurality of product operation alternative elements 10XA, 10XB, and 10XC to perform product operations that the plurality of product operation elements 10BA, 10BB, and 10BC performed before malfunctioning.

Next, in step S21, when causing the plurality of product operation alternative elements 10XA, 10XB, and 10XC to perform product operations that the plurality of product operation elements 10AA, 10AB, and 10AC performed before malfunctioning, the function replacer 14 sets the resistance values of the plurality of product operation alternative elements 10XA, 10XB, and 10XC to values equal to the resistance values of the plurality of product operation elements 10AA, 10AB, and 10AC before malfunctioning. For example, the resistance values of the product operation elements 10AA, 10AB, and 10AC before malfunctioning are stored in a storage unit (not shown). The function replacer 14 reads the resistance values from the storage unit and changes the resistance values of the plurality of product operation alternative elements 10XA, 10XB, and 10XC to the read resistance values.

Also, when causing the plurality of product operation alternative elements 10XA, 10XB, and 10XC to perform product operations that the plurality of product operation elements 10BA, 10BB, and 10BC performed before malfunctioning, the function replacer 14 sets the resistance values of the plurality of product operation alternative elements 10XA, 10XB, and 10XC to values equal to the resistance values of the plurality of product operation elements 10BA, 10BB, and 10BC before malfunctioning.

<Fourth Embodiment> (where Resistance Change Elements are General Variable Resistors)

Hereinafter, a fourth embodiment of the product-sum operation device of the present invention will be described.

The product-sum operation device 1 of the fourth embodiment is configured similar to the product-sum operation device 1 of the third embodiment described above, except for the points described below. Therefore, according to the product-sum operation device 1 of the fourth embodiment, the same effects as those of the product-sum operation device 1 of the third embodiment described above can be obtained except for the points described below.

Figure 12:
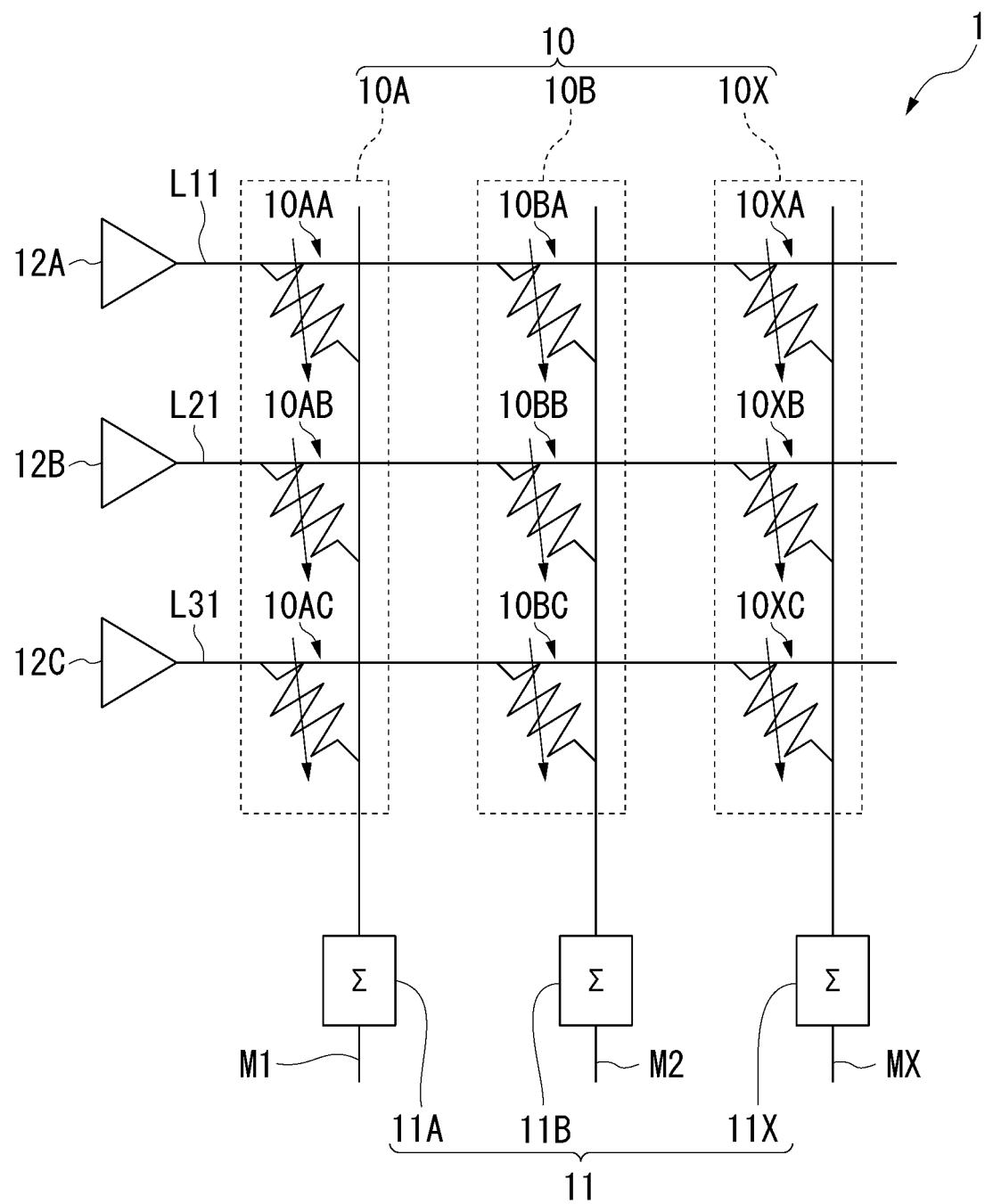
FIG. 12 is a diagram showing an example of a partial configuration of a product-sum operation device of a fourth embodiment.

FIG. 12 is a diagram showing an example of a partial configuration of the product-sum operation device 1 of the fourth embodiment.

In the product-sum operation device 1 of the third embodiment, the product operation elements 10AA to 10AC and 10BA to 10BC and the product operation alternative elements 10XA to 10XC are constituted by magnetoresistance effect elements. On the other hand, in the product-sum operation device 1 of the fourth embodiment, product operation elements 10AA to 10AC and 10BA to 10BC and product operation alternative elements 10XA to 10XC are constituted by general resistance change elements (variable resistors).

Specifically, in the example shown in FIG. 10, each of the product operation elements 10AA to 10AC and 10BA to 10BC and the product operation alternative elements 10XA to 10XC has a read terminal, a write terminal, and a common terminal. On the other hand, in the example shown in FIG. 12, each of the product operation elements 10AA to 10AC and 10BA to 10BC and the product operation alternative elements 10XA to 10XC has a first terminal and a second terminal.

In the example shown in FIG. 12, the first terminals of the product operation elements 10AA and 10BA and the product operation alternative element 10XA are connected to a line L11. The first terminals of the product operation element 10AB and 10BB and the product operation alternative element 10XB are connected to a line L21. The first terminals of the product operation element 10AC and 10BC and the product operation alternative element 10XC are connected to a line L31.

The second terminals of the product operation elements 10AA to 10AC are connected to a line M1. The second terminals of the product operation elements 10BA to 10BC are connected to a line M2. The second terminals of the product operation alternative elements 10XA to 10XC are connected to a line MX.

A sum operator 11 includes an output detector 11A that detects the sum of outputs from the second terminals of the product operation elements 10AA to 10AC, an output detector 11B that detects the sum of outputs from the second terminals of the product operation elements 10BA to 10BC, and an alternative output detector 11X that detects the sum of outputs from the second terminals of the product operation alternative elements 10XA to 10XC.

Fifth Embodiment

Hereinafter, a fifth embodiment of the product-sum operation device of the present invention will be described.

The product-sum operation device 1 of the fifth embodiment is configured similar to the product-sum operation device 1 of the first embodiment described above, except for the points described below. Therefore, according to the product-sum operation device 1 of the fifth embodiment, the same effects as those of the product-sum operation device 1 of the first embodiment described above can be obtained except for the points described below.

Figure 13:
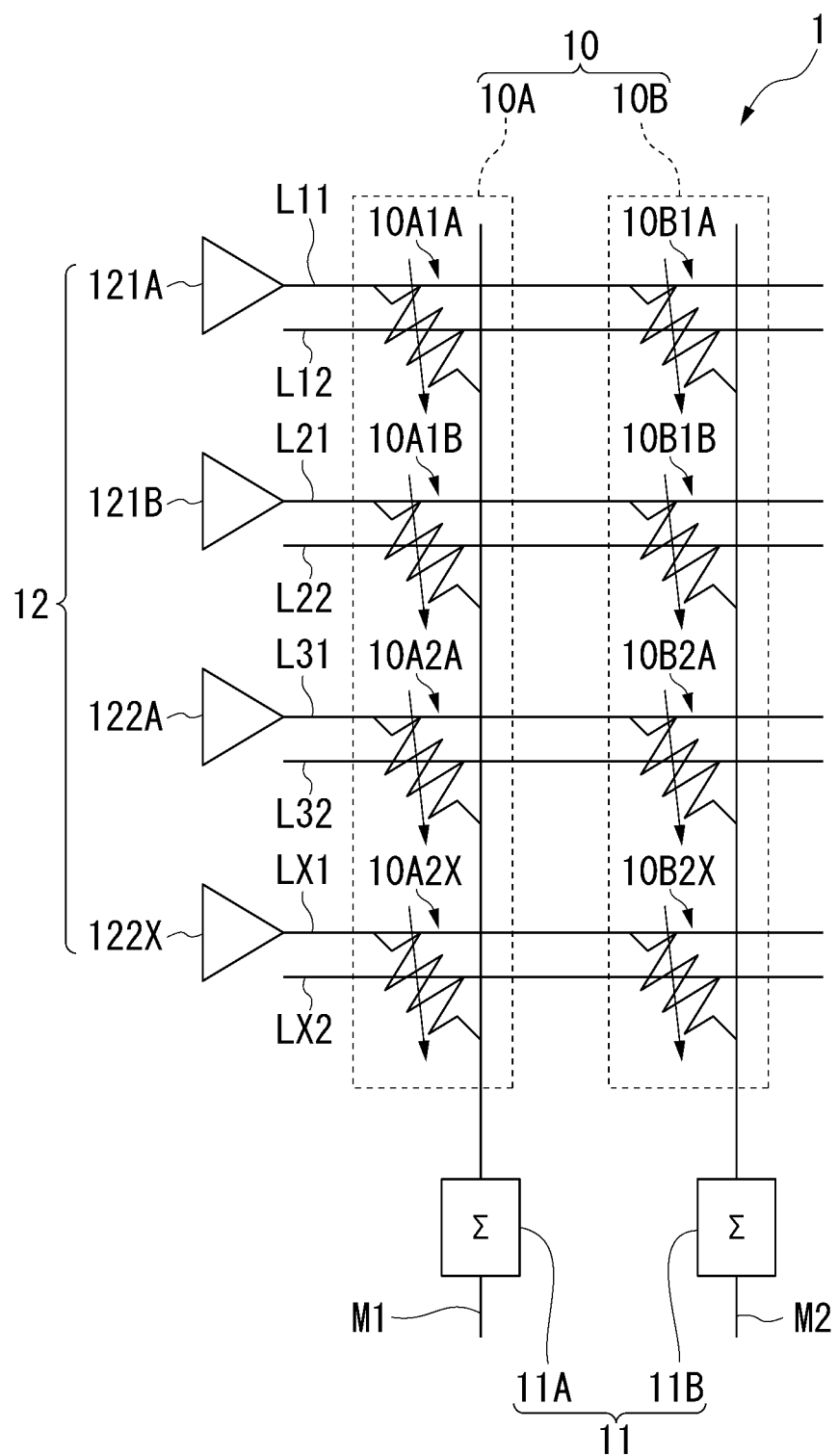
FIG. 13 is a diagram showing an example of a partial configuration of a product-sum operation device of a fifth embodiment.
Figure 14:
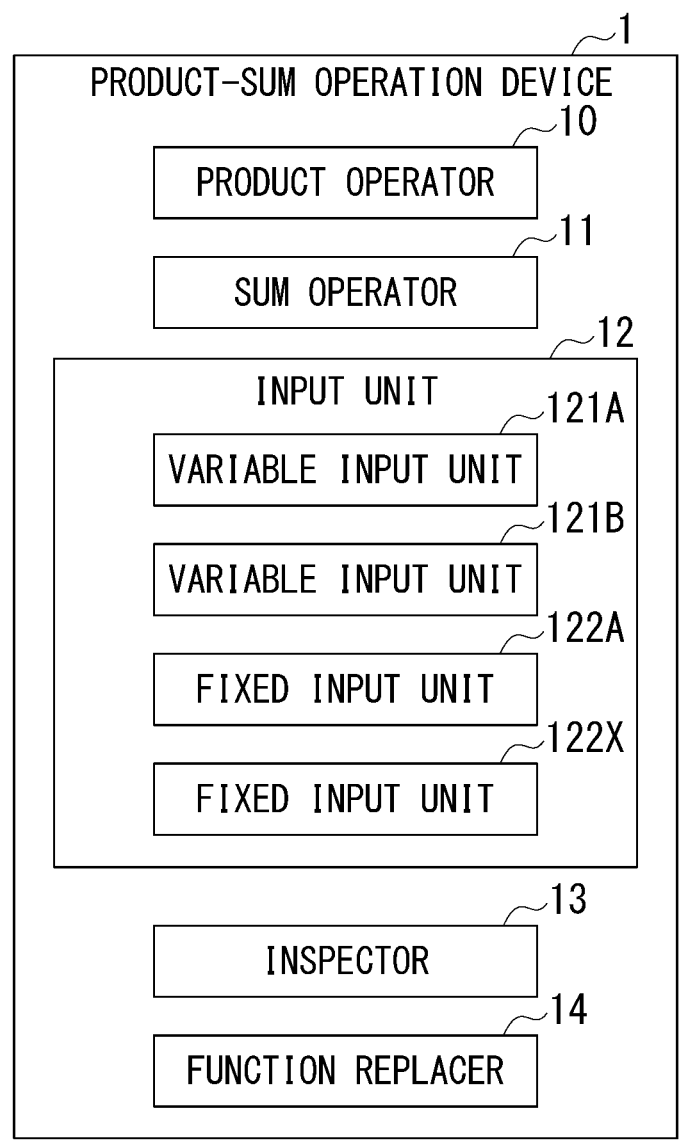
FIG. 14 is a diagram showing an example of an overall configuration of the product-sum operation device of the fifth embodiment.

FIG. 13 is a diagram showing an example of a partial configuration of the product-sum operation device 1 of the fifth embodiment. FIG. 14 is a diagram showing an example of an overall configuration of the product-sum operation device 1 of the fifth embodiment.

In the example shown in FIGS. 13 and 14, the product-sum operation device 1 of the fifth embodiment includes a product operator 10, a sum operator 11, an input unit 12, an inspector 13, and a function replacer 14. The product operator 10 includes a column 10A and a column 10B. The input unit 12 includes variable input units 121A and 121B and fixed input units 122A and 122X.

In the example shown in FIG. 13, the column 10A includes variable-input product operation elements 10A1A and 10A1B, a fixed-input product operation element 10A2A, and a fixed-input alternative element 10A2X. The fixed-input alternative element 10A2X is used instead of the fixed-input product operation element 10A2A when the fixed-input product operation element 10A2A has malfunctioned. The column 10B includes variable-input product operation elements 10B1A and 10B1B, a fixed-input product operation element 10B2A, and a fixed-input alternative element 10B2X. The fixed-input alternative element 10B2X is used instead of the fixed-input product operation element 10B2A when the fixed-input product operation element 10B2A has malfunctioned.

In the example shown in FIG. 13, the column 10A includes two variable-input product operation elements 10A1A and 10A1B, one fixed-input product operation element 10A2A, and one fixed-input alternative element 10A2X, and the column 10B includes two variable-input product operation elements 10B1A and 10B1B, one fixed-input product operation element 10B2A, and one fixed-input alternative element 10B2X. Also, in another example, the column 10A may include any number (specifically, a plurality) of variable-input product operation elements other than two, any number of fixed-input product operation elements other than one, and any number of fixed-input alternative elements other than one, and the column 10B may include any number (specifically, a plurality) of variable-input product operation elements other than two, any number of fixed-input product operation elements other than one, and any number of fixed-input alternative elements other than one.

In the example shown in FIG. 13, each of the plurality of variable-input product operation elements 10A1A, 10A1B, 10B1A, and 10B1B, the plurality of fixed-input product operation elements 10A2A and 10B2A, and the plurality of fixed-input alternative elements 10A2X and 10B2X is a resistance change element having a read terminal, a write terminal, and a common terminal.

The read terminals of the variable-input product operation elements 10A1A and 10B1A are connected to a line L11. The line L11 is connected to a variable input unit 121A that inputs a variable signal to the variable-input product operation elements 10A1A and 10B1A. The write terminals of the variable-input product operation elements 10A1A and 10B1A are connected to a line L12.

The read terminals of the variable-input product operation elements 10A1B and 10B1B are connected to a line L21. The line L21 is connected to a variable input unit 121B that inputs a variable signal to the variable-input product operation elements 10A1B and 10B1B. The write terminals of the variable-input product operation elements 10A1B and 10B1B are connected to a line L22.

The read terminals of the fixed-input product operation elements 10A2A and 10B2A are connected to a line L31. The line L31 is connected to a fixed input unit 122A that inputs a fixed signal, which is a determined signal, to the fixed-input product operation elements 10A2A and 10B2A. The write terminals of the fixed-input product operation elements 10A2A and 10B2A are connected to a line L32.

The read terminals of the fixed-input alternative elements 10A2X and 10B2X are connected to a line LX1. The line LX1 is connected to a fixed input unit 122X that inputs a fixed signal, which is a determined signal, to the fixed-input alternative elements 10A2X and 10B2X. The write terminals of the fixed-input alternative elements 10A2X and 10B2X are connected to a line LX2.

The fixed signal input to the fixed-input product operation elements 10A2A and 10B2A and the fixed-input alternative elements 10A2X and 10B2X is synchronized with the variable signals input to the variable-input product operation elements 10A1A, 10A1B, 10B1A, and 10B1B.

The common terminals of the variable-input product operation elements 10A1A and 10A1B, the fixed-input product operation element 10A2A, and the fixed-input alternative element 10A2X are connected to a line M1. The common terminals of the variable-input product operation elements 10B1A and 10B1B, the fixed-input product operation element 10B2A, and the fixed-input alternative element 10B2X are connected to a line M2.

The sum operator 11 includes output detectors 11A and 11B.

When the fixed-input alternative element 10A2X is not used, the output detector 11A detects the sum of outputs from the variable-input product operation elements 10A1A and 10A1B and the fixed-input product operation element 10A2A. For example, when the fixed-input product operation element 10A2A has malfunctioned and the fixed-input alternative element 10A2X is used instead of the malfunctioning fixed-input product operation element 10A2A, the output detector 11A detects the sum of outputs from the variable-input product operation elements 10A1A and 10A1B and the fixed-input alternative element 10A2X.

When the fixed-input alternative element 10B2X is not used, the output detector 11B detects the sum of outputs from the variable-input product operation elements 10B1A and 10B1B and the fixed-input product operation element 10B2A. For example, when the fixed-input product operation element 10B2A has malfunctioned and the fixed-input alternative element 10B2X is used instead of the malfunctioning fixed-input product operation element 10B2A, the output detector 11B detects the sum of outputs from the variable-input product operation elements 10B1A and 10B1B and the fixed-input alternative element 10B2X.

The output detector 11A is disposed on the line M1. The output detector 11B is disposed on the line M2.

In the example shown in FIGS. 13 and 14, the inspector 13 inspects whether or not the fixed-input product operation element 10A2A has malfunctioned.

To inspect whether or not the fixed-input product operation element 10A2A has malfunctioned, for example, the output detector 11A detects an output from the fixed-input product operation element 10A2A in a state in which the variable input unit 121A does not input a signal to the variable-input product operation element 10A1A, the variable input unit 121B does not input a signal to the variable-input product operation element 10A1B, the fixed input unit 122X does not input a signal to the fixed-input alternative element 10A2X, and the fixed input unit 122A inputs a signal to the fixed-input product operation element 10A2A. In this state, an output from the variable-input product operation element 10A1A is zero, an output from the variable-input product operation element 10A1B is zero, and an output from the fixed-input alternative element 10A2X is zero. The inspector 13 determines whether or not the fixed-input product operation element 10A2A has malfunctioned on the basis of the detection value of the output detector 11A.

In addition, in the example shown in FIGS. 13 and 14, the inspector 13 inspects whether or not the fixed-input product operation element 10B2A has malfunctioned.

To inspect whether or not the fixed-input product operation element 10B2A has malfunctioned, for example, the output detector 11B detects an output from the fixed-input product operation element 10B2A in a state in which the variable input unit 121A does not input a signal to the variable-input product operation element 10B1A, the variable input unit 121B does not input a signal to the variable-input product operation element 10B1B, the fixed input unit 122X does not input a signal to the fixed-input alternative element 10B2X, and the fixed input unit 122A inputs a signal to the fixed-input product operation element 10B2A. In this state, an output from the variable-input product operation element 10B1A is zero, an output from the variable-input product operation element 10B1B is zero, and an output from the fixed-input alternative element 10B2X is zero. The inspector 13 determines whether or not the fixed-input product operation element 10B2A has malfunctioned on the basis of the detection value of the output detector 11B.

When the inspector 13 has detected that the fixed-input product operation element 10A2A has malfunctioned, the function replacer 14 causes the fixed-input alternative element 10A2X to perform a product operation that the malfunctioning fixed-input product operation element 10A2A performed before malfunctioning.

The resistance value of the fixed-input alternative element 10A2X that performs the product operation that the malfunctioning fixed-input product operation element 10A2A performed before malfunctioning is preset to an intermediate value that is greater than a minimum value of a resistance value fluctuation range of the fixed-input alternative element 10A2X and smaller than a maximum value of the resistance value fluctuation range.

When the inspector 13 has detected that the fixed-input product operation element 10B2A has malfunctioned, the function replacer 14 causes the malfunctioning fixed-input alternative element 10B2X to perform a product operation that the fixed-input product operation element 10B2A performed before malfunctioning.

The resistance value of the fixed-input alternative element 10B2X that performs the product operation that the malfunctioning fixed-input product operation element 10B2A performed before malfunctioning is preset to an intermediate value that is greater than a minimum value of a resistance value fluctuation range of the fixed-input alternative element 10B2X and smaller than a maximum value of the resistance value fluctuation range.

In the example shown in FIG. 13, the fixed-input alternative element 10A2X is disposed adjacent to the fixed-input product operation element 10A2A. The fixed-input alternative element 10B2X is disposed adjacent to the fixed-input product operation element 10B2A.

The product-sum operation device 1 of the fifth embodiment executes the same process as in the example shown in FIG. 5.

In the product-sum operation device 1 of the fifth embodiment, in step S12 of FIG. 5, the inspector 13 inspects the fixed-input product operation elements 10A2A and 10B2A. Specifically, as described above, the inspector 13 performs an inspection of whether or not the fixed-input product operation element 10A2A has malfunctioned and an inspection of whether or not the fixed-input product operation element 10B2A has malfunctioned.

In the product-sum operation device 1 of the fifth embodiment, in step S13 of FIG. 5, for example, the function replacer 14 determines whether or not any of the fixed-input product operation elements 10A2A and 10B2A has malfunctioned on the basis of the inspection result of the inspector 13. When any of the fixed-input product operation elements 10A2A and 10B2A has malfunctioned, the process proceeds to step S14. When the fixed-input product operation elements 10A2A and 10B2A are all normal, the routine shown in FIG. 5 ends.

In the product-sum operation device 1 of the fifth embodiment, in step S14 of FIG. 5, the function replacer 14 replaces functions of the malfunctioning fixed-input product operation elements 10A2A and 10B2A with those of the fixed-input alternative elements 10A2X and 10B2X. That is, the function replacer 14 causes the fixed-input alternative elements 10A2X and 10B2X to perform product operations that the malfunctioning fixed-input alternative elements 10A2X and 10B2X performed before malfunctioning.

For example, when the inspector 13 has determined that the fixed-input product operation element 10A2A has malfunctioned, the function replacer 14 causes the fixed-input alternative element 10A2X to perform a product operation that the malfunctioning fixed-input product operation element 10A2A performed before malfunctioning. Specifically, for example, the function replacer 14 changes the resistance value of the fixed-input alternative element 10A2X from the intermediate value described above to the resistance value of the fixed-input product operation element 10A2A before malfunctioning.

For example, the resistance value of the fixed-input product operation element 10A2A before malfunctioning is stored in the storage unit. The function replacer 14 reads the resistance value from the storage unit and changes the resistance value of the fixed-input alternative element 10A2X to the read resistance value.

Similarly, when the inspector 13 has determined that the fixed-input product operation element 10B2A has malfunctioned, the function replacer 14 causes the fixed-input alternative element 10B2X to perform a product operation that the malfunctioning fixed-input product operation element 10B2A performed before malfunctioning. Specifically, for example, the function replacer 14 changes the resistance value of the fixed-input alternative element 10B2X from the intermediate value described above to the resistance value of the fixed-input product operation element 10B2A before malfunctioning.

<Sixth Embodiment> (where Resistance Change Elements are General Variable Resistors)

Hereinafter, a sixth embodiment of the product-sum operation device of the present invention will be described.

The product-sum operation device 1 of the sixth embodiment is configured similar to the product-sum operation device 1 of the fifth embodiment described above, except for the points described below. Therefore, according to the product-sum operation device 1 of the sixth embodiment, the same effects as those of the product-sum operation device 1 of the fifth embodiment described above can be obtained except for the points described below.

Figure 15:
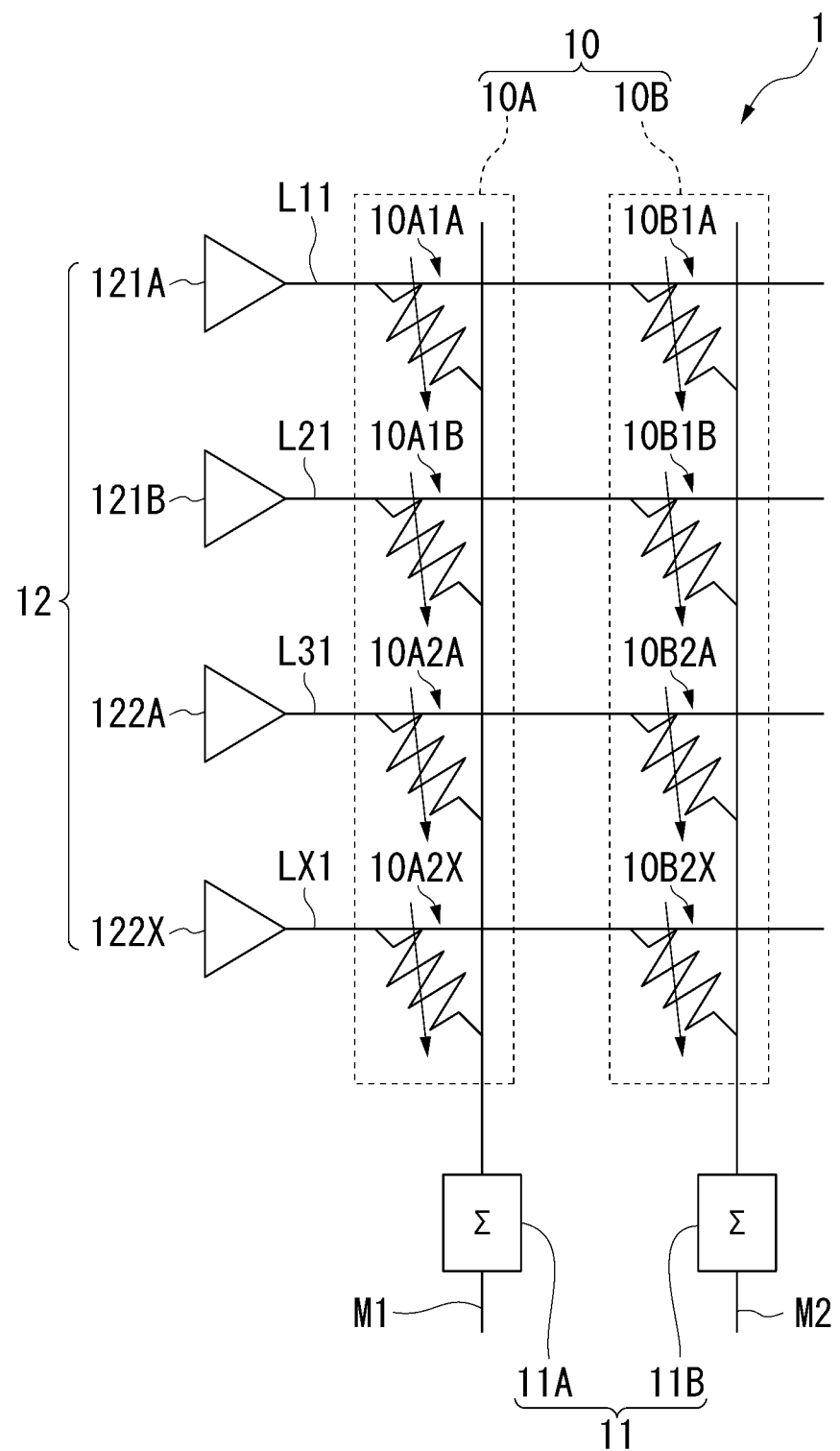
FIG. 15 is a diagram showing an example of a partial configuration of a product-sum operation device of a sixth embodiment.

FIG. 15 is a diagram showing an example of a partial configuration of the product-sum operation device 1 of the sixth embodiment.

In the product-sum operation device 1 of the first embodiment, the variable-input product operation elements 10A1A, 10A1B, 10B1A, and 10B1B, the fixed-input product operation elements 10A2A and 10B2A, and the fixed-input alternative elements 10A2X and 10B2X are constituted by magnetoresistance effect elements. On the other hand, in the product-sum operation device 1 of the sixth embodiment, variable-input product operation elements 10A1A, 10A1B, 10B1A, and 10B1B, fixed-input product operation elements 10A2A and 10B2A, and fixed-input alternative elements 10A2X and 10B2X are constituted by general resistance change elements (variable resistors).

Specifically, in the example shown in FIG. 13, each of the variable-input product operation elements 10A1A, 10A1B, 10B1A, and 10B1B, the fixed-input product operation elements 10A2A and 10B2A, and the fixed-input alternative elements 10A2X and 10B2X has a read terminal, a write terminal, and a common terminal. On the other hand, in the example shown in FIG. 15, each of the variable-input product operation elements 10A1A, 10A1B, 10B1A, and 10B1B, the fixed-input product operation elements 10A2A and 10B2A, and the fixed-input alternative elements 10A2X and 10B2X has a first terminal and a second terminal.

In the example shown in FIG. 15, the first terminals of the variable-input product operation elements 10A1A and 10B1A are connected to a line L11. The first terminals of the variable-input product operation elements 10A1B and 10B1B are connected to a line L21. The first terminals of the fixed-input product operation elements 10A2A and 10B2A are connected to a line L31. The first terminals of the fixed-input alternative elements 10A2X and 10B2X are connected to a line LX1.

The second terminals of the variable-input product operation elements 10A1A and 10A1B, the fixed-input product operation element 10A2A, and the fixed-input alternative element 10A2X are connected to a line M1. The second terminals of the variable-input product operation elements 10B1A and 10B1B, the fixed-input product operation element 10B2A, and the fixed-input alternative element 10B2X are connected to a line M2.

A sum operator 11 includes an output detector 11A that detects the sum of outputs from the second terminals of the variable-input product operation elements 10A1A and 10A1B and the fixed-input product operation element 10A2A when the fixed-input alternative element 10A2X is not used and an output detector 11B that detects the sum of outputs from the second terminals of the variable-input product operation elements 10B1A and 10B1B and the fixed-input product operation element 10B2A when the fixed-input alternative element 10A2X is not used.

Although embodiments of the present invention have been described above in detail with reference to the drawings, the specific configurations thereof are not limited to those of the embodiments and also include various modifications and substitutions without departing from the spirit of the present invention. The specific configurations may also include combinations of the configurations described in the above embodiments.

A program for realizing the functions of each device (for example, the product-sum operation device 1) according to the embodiments shown above may be recorded on a computer readable recording medium (storage medium) and a computer system may be caused to read and execute the program recorded on the recording medium to perform the processing.

The "computer system" referred to here may include an operating system (OS) or hardware such as peripheral devices.

The "computer readable recording medium" refers to a portable medium such as a flexible disk, a magneto-optical disk, a read only memory (ROM), a writable nonvolatile memory such as a flash memory, or a digital versatile disc (DVD), or a storage device such as a hard disk provided in a computer system. The recording medium may be, for example, a recording medium that temporarily records data.

It is assumed that the "computer readable recording medium" includes one that holds the program for a certain period of time, like a volatile memory (for example, a dynamic random access memory (DRAM)) provided in a computer system which serves as a server or a client when the program has been transmitted via a network such as the Internet or a communication line such as a telephone line.

The program may also be transmitted from a computer system in which the program is stored in a storage device or the like to another computer system via a transmission medium or by transmission waves in the transmission medium. Here, the "transmission medium" for transmitting the program refers to a medium having a function of transmitting information, like a network (a communication network) such as the Internet or a communication line (a communication wire) such as a telephone line.

The program may be one for realizing some of the above-described functions. The program may also be a so-called differential file (differential program) which can realize the above-described functions in combination with a program already recorded in the computer system.

In a computer, for example, a processor such as a central processing unit (CPU) reads and executes the program stored in a memory.

REFERENCE SIGNS LIST

1 Product-sum operation device
2 Product-sum operation device

10 Product operator
10A Column
10AA Product operation element
10AB Product operation element
10AC Product operation element
10AX Alternative element
10A1A Variable-input product operation element
10A1B Variable-input product operation element
10A2A Fixed-input product operation element
10A2X Fixed-input alternative element
10B Column
10BA Product operation element
10BB Product operation element
10BC Product operation element
10BX Alternative element
10B1A Variable-input product operation element
10B1B Variable-input product operation element
10B2A Fixed-input product operation element
10B2X Fixed-input alternative element
10X Spare column
10XA Product operation alternative element
10XB Product operation alternative element
10XC Product operation alternative element
11 Sum operator
11A Output detector
11B Output detector
11X Alternative output detector
12 Input unit
12A Input unit
12B Input unit
12C Input unit
12X Input unit
121A Variable input unit
121B Variable input unit
122A Fixed input unit
122X Fixed input unit
13 Inspector
14 Function replacer
100 Neuromorphic device
101 Input layer
101A, 101B, 101C, 101D Node
102 Hidden layer
102A, 102B, 102C Node
103 Output layer
103A, 103B, 103C Node
A Magnetoresistance effect element
AA Write terminal
AB Common terminal
AC Read terminal
A1 Magnetization free layer
A11 First region
A12 Second region
A2 Magnetization fixed layer
A3 Nonmagnetic layer
DW Domain wall
L11 Line
L12 Line
L21 Line
L22 Line
L31 Line
L32 Line
LX1 Line
LX2 Line
M1 Line
M2 Line
MX Line

What is claimed is:

1. A product-sum operation device comprising a product operator and a sum operator, wherein the product operator includes a plurality of product operation elements and at least one alternative element that, when any of the plurality of product operation elements has malfunctioned, is used instead of the malfunctioning product operation element,
the plurality of product operation elements and the alternative element are each a resistance change element,
the sum operator includes an output detector, and
the output detector is configured to detect a sum of outputs from a plurality of product operation elements connected to the same line when the alternative element is not used.

2. A method for using the product-sum operation device according to claim 1, wherein the product-sum operation device further comprises an inspector configured to inspect whether or not each of the plurality of product operation elements has malfunctioned, and
the method comprises an inspection process in which the inspector is configured to determine whether or not any of the plurality of product operation elements connected to the same line has malfunctioned on the basis of outputs from the plurality of product operation elements detected by the output detector.

3. The method for using the product-sum operation device according to claim 2, wherein the product-sum operation device further comprises a function replacer, and
the method further comprises a function replacement process in which, when the inspector has detected that any of the plurality of product operation elements has malfunctioned, the function replacer causes the alternative element to perform a product operation that the malfunctioning product operation element performed before malfunctioning.

4. The method for using the product-sum operation device according to claim 3, wherein a resistance value of the alternative element that performs the product operation that the malfunctioning product operation element performed before malfunctioning is preset to an intermediate value that is greater than a minimum value of a resistance value fluctuation range of the alternative element and smaller than a maximum value of the resistance value fluctuation range.

5. The product-sum operation device according to claim 1, wherein the at least one alternative element is a plurality of product operation alternative elements, and
the sum operator further includes an alternative output detector configured to detect a sum of outputs from the plurality of product operation alternative elements.

6. The product-sum operation device according to claim 1, wherein the alternative element is disposed on a position sandwiching the plurality of product operation elements connected to the same line with the output detector in the line connected to the output detector.

7. The product-sum operation device according to claim 1, wherein the alternative element is disposed between the output detector and the plurality of product operation elements connected to the same line.

8. The product-sum operation device according to claim 1, wherein the plurality of product operation elements connected to the same line include a first product operation element and a second product operation element, and
the alternative element is disposed between the first product operation element and the second product operation element.

9. The product-sum operation device according to claim 1, wherein the resistance change element is a magnetoresistance effect element exhibiting a magnetoresistance effect, and
the magnetoresistance effect element includes:
a magnetization free layer having a domain wall;
a magnetization fixed layer whose magnetization direction is fixed; and
a nonmagnetic layer sandwiched between the magnetization free layer and the magnetization fixed layer.

10. A neuromorphic device comprising the product-sum operation device according to claim 1.

11. A method for using the product-sum operation device according to claim 5, wherein the product-sum operation device further comprises an inspector and a function replacer, and
the method comprises:
a function replacement process in which, when the inspector has detected that any of the plurality of product operation elements has malfunctioned, the function replacer causes the plurality of product operation alternative elements to perform product operations that the plurality of product operation elements performed before malfunctioning; and
a resistance value setting process in which the function replacer sets resistance values of the plurality of product operation alternative elements to values equal to resistance values of the plurality of product operation elements before malfunctioning.

12. A method for using the product-sum operation device according to claim 1, wherein the plurality of product operation elements include a plurality of variable-input product operation elements and at least one fixed-input product operation element,
the alternative element is a fixed-input alternative element,
the product-sum operation device further comprises:
a variable input unit configured to input a variable signal to the plurality of variable-input product operation elements;
a fixed input unit configured to input a determined signal to the fixed-input product operation element and the fixed-input alternative element in synchronization with the variable signal;
an inspector configured to inspect whether or not the fixed-input product operation element has malfunctioned; and
a function replacer, and
the method comprises:
an inspection process in which the inspector is configured to determine whether or not each of the fixed-input product operation element has malfunctioned on the basis of an output from the fixed-input product operation element detected by the output detector; and
a function replacement process in which, when the inspector has detected that the fixed-input product operation element has malfunctioned, the function replacer causes the fixed-input alternative element to perform a product operation that the fixed-input product operation element performed before malfunctioning.

13. The method for using the product-sum operation device according to claim 12, wherein the fixed-input alternative element is disposed adjacent to the fixed-input product operation element.

14. The product-sum operation device according to claim 1, wherein the resistance change element has a write terminal, a common terminal, and a read terminal.

* * * * *